(12) United States Patent
Makita et al.

(10) Patent No.: US 7,809,042 B2
(45) Date of Patent: Oct. 5, 2010

(54) TWO-WAVELENGTH SEMICONDUCTOR LASER DEVICE AND ITS FABRICATING METHOD

(75) Inventors: Kouji Makita, Hyogo (JP); Takayuki Kashima, Hyogo (JP)

(73) Assignee: Panasonic Corporation, Osaka (JP)

( * ) Notice: Subject to any disclaimer, the term of this patent is extended or adjusted under 35 U.S.C. 154(b) by 91 days.

(21) Appl. No.: 12/269,583

(22) Filed: Nov. 12, 2008

(65) Prior Publication Data
US 2009/0180508 A1    Jul. 16, 2009

(30) Foreign Application Priority Data
Jan. 11, 2008 (JP) .............................. 2008-004278

(51) Int. Cl.
*H01S 5/00* (2006.01)
(52) U.S. Cl. .............................. 372/50.121; 372/43.01; 372/45.01; 372/50.1; 372/50.122; 372/50.124
(58) Field of Classification Search ................ 372/50.1, 372/50.121, 50.122, 50.124, 43.01, 45.01
See application file for complete search history.

(56) References Cited

U.S. PATENT DOCUMENTS

| | | | |
|---|---|---|---|
| 7,260,128 B2 | 8/2007 | Ukai | |
| 7,408,968 B2 * | 8/2008 | Fukuhisa et al. | 372/50.121 |
| 7,418,019 B2 * | 8/2008 | Takayama et al. | 372/50.121 |
| 7,505,502 B2 * | 3/2009 | Kashima et al. | 372/50.121 |
| 7,613,220 B2 * | 11/2009 | Takayama et al. | 372/50.121 |
| 2002/0075923 A1 | 6/2002 | Tashiro et al. | |
| 2005/0018733 A1 | 1/2005 | Wada et al. | |
| 2005/0069005 A1 | 3/2005 | Nishida et al. | |
| 2006/0239321 A1 * | 10/2006 | Kume et al. | 372/50.121 |

(Continued)

FOREIGN PATENT DOCUMENTS

JP    11-274644    10/1999

(Continued)

OTHER PUBLICATIONS

IEEE Journal of Quantum Electronics, vol. 29, No. 6, Jun. 1993 pp. 1874-1879.

(Continued)

*Primary Examiner*—Minsun Harvey
*Assistant Examiner*—Yuanda Zhang
(74) *Attorney, Agent, or Firm*—McDermott Will & Emery LLP

(57) ABSTRACT

A two-wavelength semiconductor laser device includes a first semiconductor laser device including a first-conductivity type first cladding layer, a first guide layer made of AlGaAs mixed crystal, a first quantum well active layer having a barrier layer made of AlGaAs mixed crystal, a second guide layer made of AlGaAs mixed crystal, and a second-conductivity type second cladding layer, and a second semiconductor laser device including a first-conductivity type third cladding layer, a third guide layer made of AlGaInP mixed crystal, a second quantum well active layer having a barrier layer made of AlGaInP mixed crystal, a fourth guide layer made of AlGaInP mixed crystal, and a second-conductivity type fourth cladding layer. At least the barrier layer included in the first quantum well active layer, the first guide layer, and the second guide layer each have an Al molar ratio of more than 0.47 and 0.60 or less.

23 Claims, 11 Drawing Sheets

U.S. PATENT DOCUMENTS

| | | |
|---|---|---|
| 2007/0058687 A1* | 3/2007 | Matsuki et al. ........ 372/50.121 |
| 2007/0064725 A1 | 3/2007 | Minami et al. |
| 2007/0064752 A1* | 3/2007 | Takayama et al. ............. 372/23 |
| 2007/0264738 A1 | 11/2007 | Nishida et al. |

FOREIGN PATENT DOCUMENTS

| | | |
|---|---|---|
| JP | 2000-292868 | 10/2000 |
| JP | 2002-111136 | 4/2002 |
| JP | 2002-185077 | 6/2002 |
| JP | 2005-109102 | 4/2005 |

OTHER PUBLICATIONS

IEEE Journal of Quantum Electronics, vol. 26, No. 5, May 1990 pp. 837-842.

Japanese Journal of Applied Physics vol. 36 (1997) pp. 2666-2670.

* cited by examiner

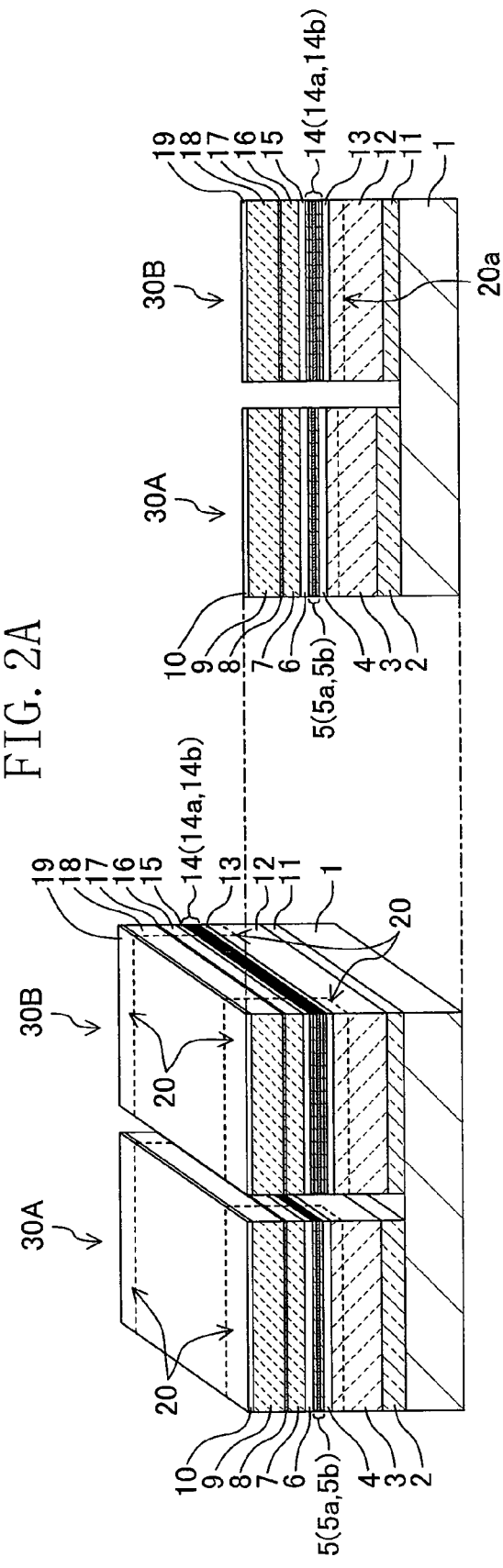
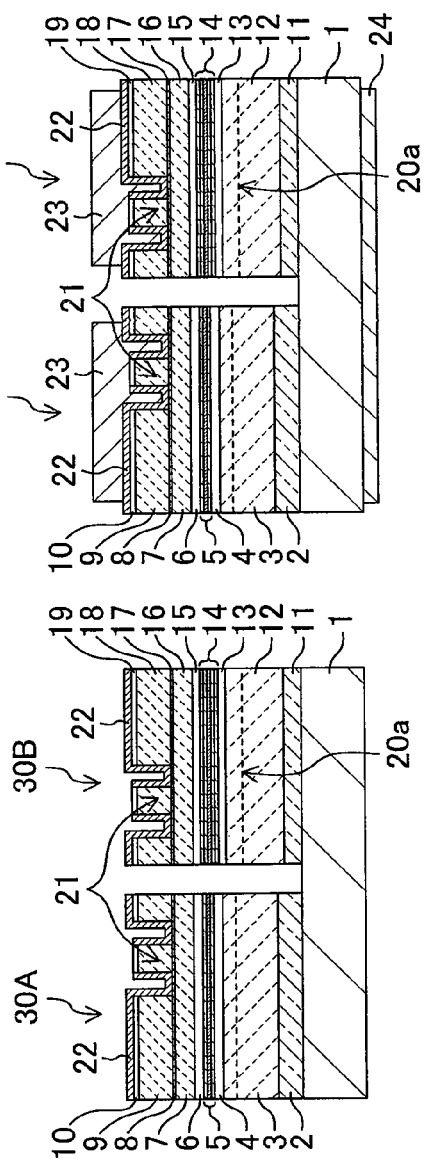
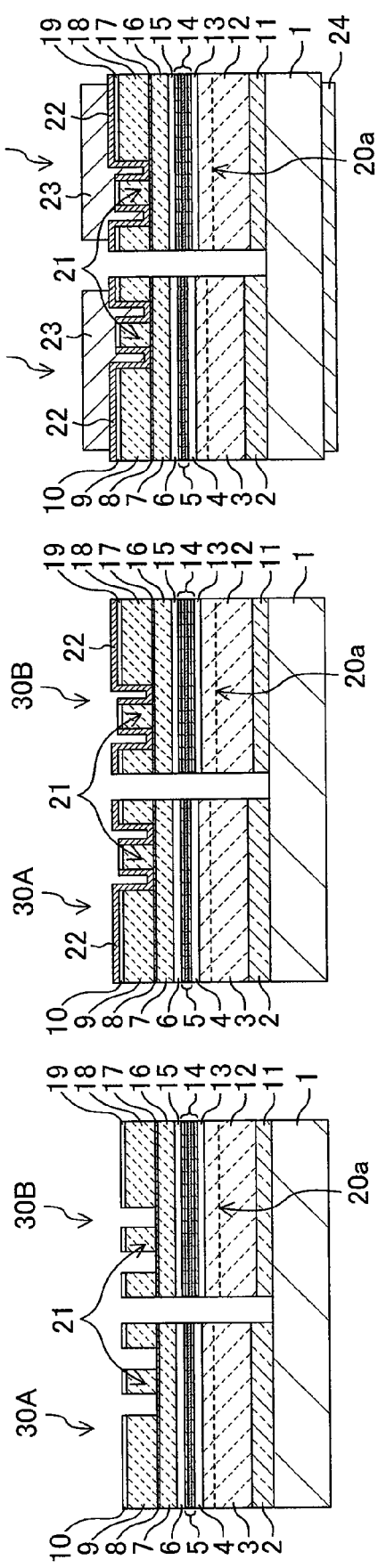

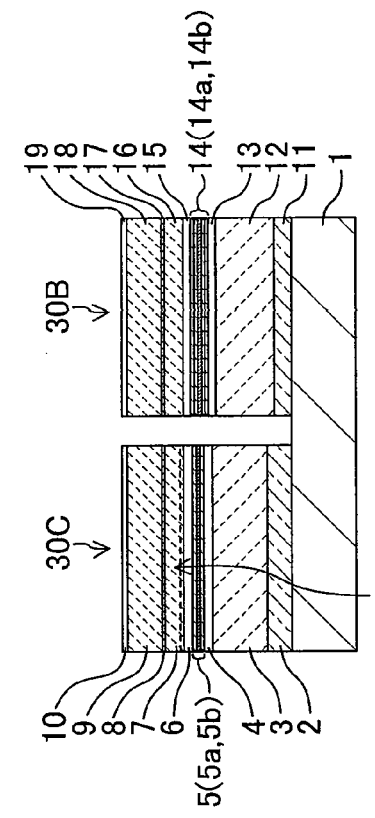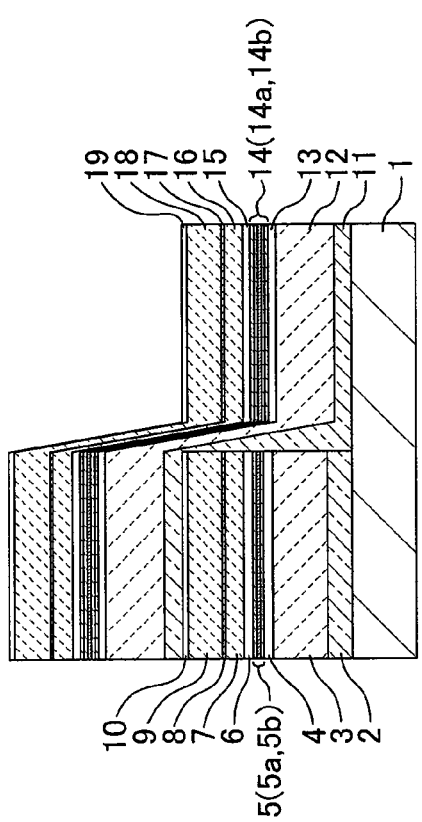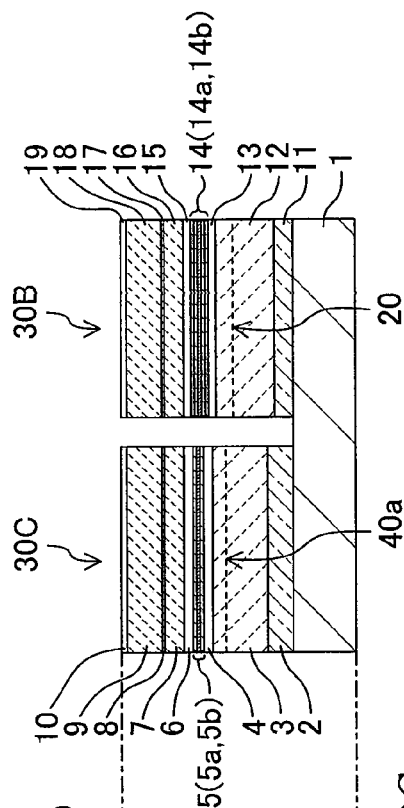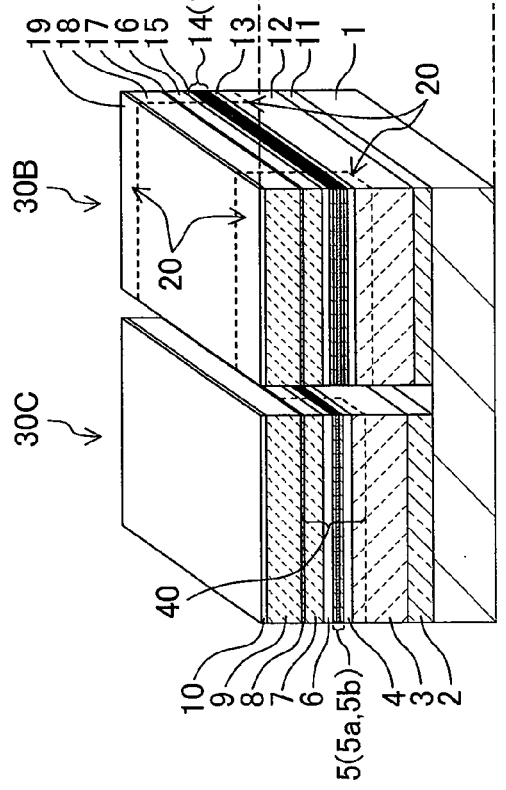
FIG. 9A
FIG. 9B
FIG. 9C

TWO-WAVELENGTH SEMICONDUCTOR LASER DEVICE AND ITS FABRICATING METHOD

BACKGROUND OF THE INVENTION

1. Field of the Invention

The present invention relates to a red (oscillation wavelength: 650-nm band) and infrared (oscillation wavelength: 780-nm band) integrated high-power two-wavelength semiconductor laser device that is used as, for example, a light source for a pickup of an optical disc device, a light source for other electronic devices and information processing devices, or the like, and a method for fabricating the two-wavelength semiconductor laser device.

2. Description of the Related Art

On the current market, there are a large-capacity Digital Video Disc (DVD) capable of high-density recording and various DVD devices that record and reproduce the disc. Taking it into account how popular DVD devices have become (e.g., DVD devices are becoming widespread as DVD recorders in homes and are often supplied as standard equipment to personal computers), the demand is expected to increase more and more in the future. On the other hand, a function of recording and reproducing a Compact Disc (CD), which has already become widespread, is simultaneously required. Therefore, it is essential to provide a capability to record and reproduce both DVDs and CDs. At present, a semiconductor laser with 650-nm band oscillation wavelengths having an active layer made of $(Al_xGa_{1-x})_yIn_{1-y}P$ mixed crystal ($0 \leq x \leq 1$, $0 \leq y \leq 1$) is employed as a laser light source for recording and reproduction of DVDs, while a semiconductor laser with 780-nm band oscillation wavelengths having an active layer made of $Al_xGa_{1-x}As$ mixed crystal ($0 \leq x \leq 1$) is employed as a laser light source for recording and reproduction of CDs.

In recent years, there is also an increasing demand for LightScribe (a technology that utilizes laser light energy to create text or graphics on a disc surface), so that higher power is required for a semiconductor laser for recording and reproducing CDs.

For a Blu-ray Disc (BD), which is expected as a high-density and large-capacity disc, a semiconductor laser with 400-nm band oscillation wavelengths is employed. It is also contemplated that a single optical system is used for both DVDs and CDs. When a semiconductor laser for BDs is mainly used, a semiconductor laser for DVDs and CDs needs to have higher power.

Incidentally, the market demands a rapid reduction in cost. To meet the demand, there is a desire for a lower-cost optical pickup included in a semiconductor laser device. There are generally two methods for reducing the cost of an optical pickup. Firstly, parts constituting an optical pickup are simplified (reduced) and their cost is reduced. A semiconductor laser is a key component and cannot be removed, but its cost can be reduced by simplifying its structure and fabrication process. Secondly, the yield of an optical pickup is improved. A cause for a decrease in yield is that semiconductor lasers for DVDs and CDs are conventionally separately arranged, so that a complicated step of optically adjusting an optical pickup is required. To avoid this, a two-wavelength laser is recently employed in which semiconductor lasers for DVDs and CDs are monolithically integrated on a substrate. Also, when a material for an optical pickup may be changed from a metal to a less expensive resin material by simplifying the optical pickup, the resultant structure may be often disadvantageous to heat radiation. It is also becoming important to improve temperature characteristics of a semiconductor laser.

Under these circumstances, there is a demand for an integrated two-wavelength semiconductor laser that has a CW light output exceeding 200 mW for each of a DVD and a CD. Meanwhile, there is also an increasing demand for a reduction in cost.

FIGS. 10A and 10B show structures of conventional integrated two-wavelength semiconductor laser devices.

In the structure of FIG. 10A, a semiconductor laser for CDs (semiconductor laser device 200A) and a semiconductor laser for DVDs (semiconductor laser device 200B) are monolithically fabricated on the same n-type GaAs substrate 100. The CD semiconductor laser device 200A is made of AlGaAs mixed crystal, while the DVD semiconductor laser device 200B is made of AlGaInP mixed crystal. Specifically, the CD semiconductor laser device 200A comprises a cladding layer 101 made of n-type AlGaAs, a light guide layer 102 made of AlGaAs, a quantum well active layer 103 made of AlGaAs, a light guide layer 104 made of AlGaAs, a cladding layer 105 made of p-type AlGaAs, an etch stop layer 106, a cladding layer 107 made of p-type AlGaAs (ridge portion), a current confining layer 108, and ohmic electrodes 109 and 119. On the other hand, the DVD semiconductor laser device 200B comprises a cladding layer 110 made of n-type AlGaInP, a light guide layer 111 made of AlGaInP, a quantum well active layer 112 made of AlGaInP, a light guide layer 113 made of AlGaInP, a cladding layer 114 made of p-type AlGaInP, an etch stop layer 115, a cladding layer 116 made of p-type AlGaInP (ridge portion), a current confining layer 117, and ohmic electrodes 118 and 119.

In a conventional two-wavelength semiconductor laser device having such a structure, the active layer structure of the high-power laser generally often has a multi-quantum well structure, and the Al molar ratios of the guide layer and the barrier layer are each generally set to have a value intermediate between those of the cladding layer and the well layer and as low as possible. This is because a layer containing a large amount of Al, which is highly reactive, tends to have a decreased level of crystallinity, so that the light emission efficiency of the active layer is highly likely to decrease. Therefore, a general guide layer and barrier layer have an Al molar ratio of about 0.3 in the CD semiconductor laser device and about 0.5 in the DVD semiconductor laser device. The guide layer and the barrier layer are often set to have the same Al molar ratio, taking into account the stabilization and simplification of a crystal growth process.

The structure of FIG. 10B is the same as that of FIG. 10A, except that the cladding layer included in the CD semiconductor laser device is made of AlGaInP mixed crystal (see, for example, Japanese Unexamined Patent Application Publication Nos. 2002-111136 and 2005-109102 (hereinafter referred to as Patent Documents 1 and 2)). Specifically, cladding layers 101a and 107a of the CD semiconductor laser device 200A are made of n-type AlGaInP and p-type AlGaInP, respectively. By employing AlGaInP mixed crystal having a large band gap as the cladding layers as in this structure, it is possible to suppress overflow of carriers from the active layer, resulting in higher power of the device.

On the other hand, in a semiconductor laser device having a Fabry-Perot type optical resonator structure, light output is often limited by Catastrophic Optical Damage (COD) at a light emitting facet. To prevent this, it is essential to provide a facet window structure (e.g., reference numeral 120 indicates a facet window structure in each of the structures of FIGS. 10A and 10B). The facet window structure selectively diffuses an impurity in the quantum well active layer in the vicinity of the light emitting facet so that the quantum well active layer has average composition, thereby expanding a band gap in the vicinity of the light emitting facet. As a result, light absorption in the vicinity of the light emitting facet can be reduced, so that COD can be suppressed.

As an impurity used for formation of such a facet window structure, Zn is generally used. It has been reported that a quantum well active layer having average composition can be generally relatively easily achieved in a semiconductor laser device made of AlGaInP mixed crystal. It has also been reported that, when Zn is used, the quantum well active layer can be caused to have average composition by thermal diffusion at about 600° C., and the COD level can be improved (see, for example, IEEE J. of Quantum Electronics, Vol. 29, No. 6, June 1993 pp. 1874-1879 and Jpn. J. Appl. Phys. Vol. 36 (1997) pp. 2666-2670 (hereinafter referred to as Non-Patent Document 1)).

On the other hand, since the diffusion rate of Zn is lower in AlGaAs mixed crystal than in AlGaInP mixed crystal, it is not easy to obtain average composition of the quantum well active layer by Zn diffusion in the semiconductor laser device 200A made of AlGaAs mixed crystal of FIG. 10A. In this regard, for example, IEEE J. of Quantum Electronics, Vol. 26, No. 5, May 1990 pp. 837-842 (hereinafter referred to as Non-Patent Document 2) introduces an example in which Zn diffusion is performed twice (double diffusion method) in the CD semiconductor laser device made of AlGaAs mixed crystal so that Zn can be diffused to the active layer. In this case, however, the diffusion temperature reaches as high as 900° C., indicating that it is difficult to diffuse Zn to AlGaAs mixed crystal.

A structure has also been proposed in which Si is used as an impurity when the facet window structure is formed. In this case, Si is introduced as an impurity by an ion implantation technique after crystal growth of a portion of the cladding layer on the quantum well active layer (see, for example, Japanese Unexamined Patent Application Publication No. 2002-185077). In this case, the remaining semiconductor layers, such as a cladding layer and the like, need to be grown again after formation of a window structure, resulting in a complicated fabrication process.

SUMMARY OF THE INVENTION

Incidentally, in the CD semiconductor laser device of FIG. 10B in which the cladding layer is made of AlGaInP mixed crystal, a phenomenon was found that whereas an impurity is more easily diffused than in the CD semiconductor laser device of FIG. 10A in which the cladding layer is made of AlGaAs mixed crystal, light absorption in a window region increases due to excessive diffusion of the impurity.

FIGS. 11A and 11B show results of measurement of wavelengths of photoluminescence (PL) light generated by irradiating the window region with excited light. FIG. 11A shows a result of measurement with respect to the CD semiconductor laser device. FIG. 11B shows a result of measurement with respect to the DVD semiconductor laser device.

As shown in FIG. 11A, it was confirmed that the wavelength of PL light in the window region tends to increase (the band gap decreases) after the diffusion time exceeds a certain value, in the CD semiconductor laser device having the structure of FIG. 10A. On the other hand, as shown in FIG. 11B, a characteristic tendency as shown in FIG. 11A was not confirmed in the DVD semiconductor laser device made of AlGaInP mixed crystal. Thus, the phenomenon appearing only in FIG. 11A is considered to be caused by generation of average composition not only in the quantum well active layer, but also in the cladding layer adjacent thereto. In this regard, the problem that the band gap of the window region in the CD semiconductor laser device having the cladding layer made of AlGaInP mixed crystal is reduced, has not been described in Patent Document 1 or Patent Document 2. It was found that the provision of the cladding layer made of AlGaInP mixed crystal is not sufficient to achieve higher power of the CD semiconductor laser device.

In AlGaAs crystal, its constituent elements have difficulty in mutual diffusion, as compared to AlGaInP crystal. Therefore, AlGaAs crystal requires a higher impurity concentration and a higher diffusion temperature. If an excessive amount of an impurity is diffused into the active layer, a disordered state due to mutual diffusion of Al and Ga can be achieved in the well layer and the barrier layers sandwiching the well layer. However, in the CD semiconductor laser device, the excessive impurity diffusion causes diffusion of constituent elements from AlGaInP crystal of the cladding layer, so that the resultant disordered crystal has a smaller band gap than that of the average composition of the well layer and the barrier layers sandwiching the well layer, which is disadvantageous to the window structure. Specifically, it was found that the influence of undesired diffusion of elements constituting the cladding layer or an excess of an impurity leads to occurrence of a crystal defect, or the above-described difference in diffusion coefficient leads to occurrence of pileup of an impurity to the quantum well active layer, so that light absorption due to free carriers increases, and therefore, a deterioration in current-light characteristics due to carrier absorption or COD at low light output may occur. Similarly, it was found that, also in the DVD semiconductor laser device, although both the quantum well active layer and the cladding layer are made of AlGaInP crystal, excessive impurity diffusion causes a deterioration in current-light characteristics or occurrence of COD at low light output.

Moreover, as described above, it is not easy to fabricate, with a simple process, the facet window structure of the CD semiconductor laser device having a quantum well active layer particularly made of AlGaAs mixed crystal so as to achieve higher power of an integrated two-wavelength semiconductor laser device. It is more difficult to fabricate a facet window structure in both the DVD and CD semiconductor laser devices with a low-cost process.

On the other hand, in the DVD semiconductor laser device, the active layer is also made of AlGaInP mixed crystal, so that it may be considered as described in Non-Patent Document 1 and Non-Patent Document 2 that the average composition of the quantum well active layer in the window region can be further promoted, and therefore, the band gap of the window region can be further increased (this can be evaluated based on the wavelength of the above-described PL light). However, as described above, it is not easy to simultaneously form a window structure in both the DVD semiconductor laser device and the CD semiconductor laser device having a cladding layer made of AlGaInP mixed crystal, which is a hindrance to achieve higher power and lower cost of the integrated two-wavelength semiconductor laser.

In view of the problems above, an object of the present invention is to provide a low-cost integrated two-wavelength semiconductor laser device in which the cladding layer of the CD semiconductor laser device is made of AlGaInP mixed crystal, characterized in that a CW light output of 200 mW or more can be stably achieved by optimizing diffusion conditions for an impurity to achieve the average composition of the quantum well active layer in the facet window region and the quantum well active layer structure, and it is easy to fabricate a facet window structure to both the CD and DVD semiconductor laser devices.

To achieve the object, a two-wavelength semiconductor laser device according to an embodiment of the present invention includes a first semiconductor laser device and a second semiconductor laser device each having a window structure in a vicinity of an optical resonator facet, on a first-conductivity type single crystal semiconductor substrate. The first semiconductor laser device includes at least a first-conductivity type first cladding layer, a first guide layer made of AlGaAs mixed crystal, a first quantum well active layer having a barrier layer made of AlGaAs mixed crystal, a second guide layer made of AlGaAs mixed crystal, and a second-conductivity type second cladding layer, sequentially formed on the semiconductor substrate. The second semiconductor laser device includes at least a first-conductivity type third cladding layer, a third guide layer made of AlGaInP mixed crystal, a second quantum well active layer having a barrier layer made of AlGaInP mixed crystal, a fourth guide layer made of AlGaInP mixed crystal, and a second-conductivity type fourth cladding layer, sequentially formed on the semiconductor substrate. At least the barrier layer included in the first quantum well active layer, the first guide layer, and the second guide layer each have an Al molar ratio of more than 0.47 and 0.60 or less.

In the two-wavelength semiconductor laser device of the embodiment of the present invention, the barrier layer included in the first quantum well active layer, the first guide layer, and the second guide layer each have an Al molar ratio of 0.53 or more and 0.60 or less.

In the two-wavelength semiconductor laser device of the embodiment of the present invention, the second cladding layer and the fourth cladding layer are each made of AlGaInP mixed crystal.

In the two-wavelength semiconductor laser device of the embodiment of the present invention, a peak concentration of a first impurity in the first quantum well active layer in the window structure of the first semiconductor laser device is higher than a peak concentration of a second impurity in the second quantum well active layer in the window structure of the second semiconductor laser device. The peak concentration of the second impurity is $1 \times 10^{18}/cm^3$ or more and $1 \times 10^{19}/cm^3$ or less.

In the two-wavelength semiconductor laser device of the embodiment of the present invention, a diffusion end closer to the semiconductor substrate of the first impurity in the window structure of the first semiconductor laser device is located in the first cladding layer. A diffusion end closer to the semiconductor substrate of the second impurity in the window structure of the second semiconductor laser device is located in the third cladding layer. A distance from the first quantum well active layer to the diffusion end closer to the semiconductor substrate of the first impurity is smaller than a distance from the second quantum well active layer to the diffusion end closer to the semiconductor substrate of the second impurity.

In the two-wavelength semiconductor laser device of the embodiment of the present invention, the distance from the first quantum well active layer to the diffusion end closer to the semiconductor substrate of the first impurity is 0.8 μm or less.

In the two-wavelength semiconductor laser device of the embodiment of the present invention, a first peak wavelength of a spectrum obtained from the window region in the first semiconductor laser device by a photoluminescence technique or a cathode luminescence technique is 730 nm or less.

A second peak wavelength of a spectrum obtained from the window region in the second semiconductor laser device by the photoluminescence technique or the cathode luminescence technique is 595 nm or less.

In the two-wavelength semiconductor laser device of the embodiment of the present invention, the first peak wavelength is 710 nm or less.

In the two-wavelength semiconductor laser device of the embodiment of the present invention, the first semiconductor laser device has an oscillation wavelength of 760 nm or more and 790 nm or less. The second semiconductor laser device has an oscillation wavelength of 650 nm or more and 670 nm or less.

In the two-wavelength semiconductor laser device of the embodiment of the present invention, the first semiconductor laser device and the second semiconductor laser device each have a light output of 200 mW or more during a CW operation.

In the two-wavelength semiconductor laser device of the embodiment of the present invention, the first semiconductor laser device and the second semiconductor laser device each have a vertical divergence angle of 18° or less.

In the two-wavelength semiconductor laser device of the embodiment of the present invention, the second guide layer has a film thickness of 10 nm or more and 43 nm or less.

In the two-wavelength semiconductor laser device of the embodiment of the present invention, the first quantum well active layer includes a well layer made of GaAs, and the second quantum well active layer includes a well layer made of GaInP.

In the two-wavelength semiconductor laser device of the embodiment of the present invention, a film thickness of the well layer of the first quantum well active layer is smaller than a film thickness of the barrier layer of the first quantum well active layer.

In the two-wavelength semiconductor laser device of the embodiment of the present invention, the well layer of the first quantum well active layer has a film thickness of 4 nm or less.

In the two-wavelength semiconductor laser device of the embodiment of the present invention, the well layer of the first quantum well active layer includes two layers.

In the two-wavelength semiconductor laser device of the embodiment of the present invention, an Al molar ratio of the second cladding layer is larger than an Al molar ratio of the fourth cladding layer.

In the two-wavelength semiconductor laser device of the embodiment of the present invention, a lattice constant of the second cladding layer is negative with respect to a lattice constant of the substrate, and a lattice constant of the fourth cladding layer is larger than the lattice constant of the second cladding layer.

In the two-wavelength semiconductor laser device of the embodiment of the present invention, the second cladding layer and the fourth cladding layer each have a doping concentration of $1 \times 10^{17}/cm^3$ or more and $1 \times 10^{18}/cm^3$ or less, and the doping concentration of the second cladding layer is smaller than the doping concentration of the fourth cladding layer.

In the two-wavelength semiconductor laser device of the embodiment of the present invention, the window structure of the first semiconductor laser device includes Zn or Si, and the window structure of the second semiconductor laser device includes Zn.

A method according to a first embodiment of the present invention is provided for fabricating a two-wavelength semiconductor laser device comprising a first semiconductor laser device and a second semiconductor laser device each having a window structure in a vicinity of an optical resonator facet, on a first-conductivity type single crystal semiconductor substrate. The method includes the steps of forming a first multilayer structure including at least a first-conductivity type first cladding layer, a first guide layer made of AlGaAs mixed crystal, a first quantum well active layer having a barrier layer made of AlGaAs mixed crystal, a second guide layer made of AlGaAs mixed crystal, and a second-conductivity type second cladding layer, sequentially stacked in a first region where the first semiconductor laser device is to be formed on the semiconductor substrate, forming a second multilayer structure including at least a first-conductivity type third cladding layer, a third guide layer made of AlGaInP mixed crystal, a second quantum well active layer having a barrier layer made of AlGaInP mixed crystal, a fourth guide layer made of AlGaInP mixed crystal, and a second-conductivity type fourth cladding layer, sequentially stacked in a region where the second semiconductor laser device is to be formed on the semiconductor substrate, the second multilayer structure being spaced from the first multilayer structure, and thermally diffusing a first impurity and a second impurity of the same species to form the window structure of the first semiconductor laser device in the first multilayer structure, the first impurity being diffused in the window structure of the first semiconductor laser device, and at the same time, form the window structure of the second semiconductor laser device in the second multilayer structure, the second impurity being diffused in the window structure of the second semiconductor laser device. A peak concentration of the first impurity in the first quantum well active layer in the window structure of the first semiconductor laser device is larger than a peak concentration of the second impurity in the second quantum well active layer in the window structure of the second semiconductor laser device. The peak concentration of the second impurity is $1 \times 10^{18}/cm^3$ or more and $1 \times 10^{19}/cm^3$ or less.

A method according to a second embodiment of the present invention is provided for fabricating a two-wavelength semiconductor laser device comprising a first semiconductor laser device and a second semiconductor laser device each having a window structure in a vicinity of an optical resonator facet, on a first-conductivity type single crystal semiconductor substrate. The method includes the steps of forming a first multilayer structure including at least a first-conductivity type first cladding layer, a first guide layer made of AlGaAs mixed crystal, a first quantum well active layer having a barrier layer made of AlGaAs mixed crystal, a second guide layer made of AlGaAs mixed crystal, and a second-conductivity type second cladding layer, sequentially stacked in a first region where the first semiconductor laser device is to be formed on the semiconductor substrate, forming a second multilayer structure including at least a first-conductivity type third cladding layer, a third guide layer made of AlGaInP mixed crystal, a second quantum well active layer having a barrier layer made of AlGaInP mixed crystal, a fourth guide layer made of AlGaInP mixed crystal, and a second-conductivity type fourth cladding layer, sequentially stacked in a region where the second semiconductor laser device is to be formed on the semiconductor substrate, the second multilayer structure being spaced from the first multilayer structure, ion-implanting a first impurity into at least the first quantum well active layer in the first multilayer structure, and thermally diffusing a second impurity of a species different from that of the first impurity to form the window structure of the second semiconductor laser device in the second multilayer structure, the second impurity being diffused in the window structure of the second semiconductor laser device, and at the same time, forming the window structure of the first semiconductor laser device, the first impurity ion-implanted in the first multilayer structure being diffused in the window structure of the first semiconductor laser device. A peak concentration of the first impurity in the first quantum well active layer in the window structure of the first semiconductor laser device is larger than a peak concentration of the second impurity in the second quantum well active layer in the window structure of the second semiconductor laser device. The peak concentration of the second impurity is $1 \times 10^{18}/cm^3$ or more and $1 \times 10^{19}/cm^3$ or less.

In the two-wavelength semiconductor laser device fabricating method of the first or second embodiment of the present invention, a diffusion end closer to the semiconductor substrate of the first impurity in the window structure of the first semiconductor laser device is located in the first cladding layer, and a diffusion end closer to the semiconductor substrate of the second impurity in the window structure of the second semiconductor laser device is located in the third cladding layer.

In the two-wavelength semiconductor laser device fabricating method of the first or second embodiment of the present invention, the thermal diffusion is performed for no longer than a time that allows a minimum peak wavelength of photoluminescence light in the window structure of the first semiconductor laser device.

In the two-wavelength semiconductor laser device fabricating method of the first or second embodiment of the present invention, the first impurity and the second impurity are Zn.

In the two-wavelength semiconductor laser device fabricating method of the first or second embodiment of the present invention, the first impurity is Si and the second impurity is Zn.

According to the integrated two-wavelength semiconductor laser device and its fabricating method of the present invention, the band gap of the facet window structure can be caused to be large without introducing an excessive amount of impurity to the quantum well active layer, and the window structure having less light absorption can be formed at the facets of both the semiconductor lasers with a simple process. Therefore, an integrated two-wavelength semiconductor laser device capable of a high-power operation can be provided with low cost.

BRIEF DESCRIPTION OF THE DRAWINGS

FIGS. 2A to 2D are cross-sectional views showing steps of fabricating the integrated two-wavelength semiconductor laser device of the first embodiment of the present invention in sequence.

FIGS. 9A to 9C are cross-sectional views showing steps of fabricating the integrated two-wavelength semiconductor laser device of the second embodiment of the present invention in sequence.

FIG. 11A shows the result of measurement with respect to a CD semiconductor laser device. FIG. 11B shows the result of measurement with respect to a DVD semiconductor laser device

DETAILED DESCRIPTION OF THE PREFERRED EMBODIMENTS

Hereinafter, embodiments of the present invention will be described with reference to the accompanying drawings.

First Embodiment

Hereinafter, an integrated two-wavelength semiconductor laser device according to a first embodiment of the present invention and its fabricating method will be described.

FIGS. 1A to 1C and FIGS. 2A to 2D are cross-sectional views showing steps of fabricating the integrated two-wavelength semiconductor laser device of the first embodiment of the present invention in sequence. It is hereinafter assumed that, for example, a two-wavelength semiconductor laser device is fabricated in which a first semiconductor laser device 30A that is, for example, a semiconductor laser for CDs (oscillation wavelength: 760 nm or more and 790 nm or less (760 nm to 790 nm)) and a second semiconductor laser device 30B that is, for example, a semiconductor laser for DVDs (oscillation wavelength: 650 nm or more and 670 nm (650 nm to 670 nm)) are monolithically integrated on a substrate.

Figure 1A:
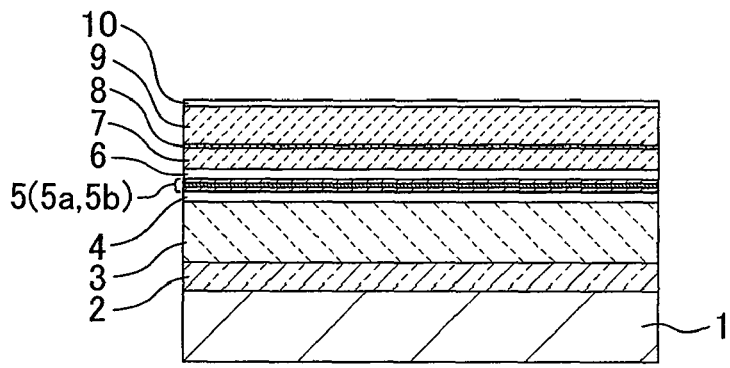
FIGS. 1A to 1D are cross-sectional views showing steps of fabricating an integrated two-wavelength semiconductor laser device according to a first embodiment of the present invention in sequence.

Initially, as shown in FIG. 1A, a crystal growing device (e.g., MOCVD, etc.) is used to deposit, on a substrate 1 made of n-type GaAs that is tilted by 10° in the [011] direction from the (100) plane, a buffer layer 2 made of n-type GaAs (film thickness: 0.5 μm), a cladding layer 3 made of n-type $(Al_{0.7}Ga_{0.3})_{0.51}In_{0.49}P$ (film thickness: 2.0 μm), a guide layer 4 made of $Al_{0.55}Ga_{0.45}As$ (film thickness: 20 nm), a quantum well active layer 5 including a well layer 5b made of GaAs (well number: 2) and a barrier layer 5a made of $Al_{0.55}Ga_{0.45}As$ (film thickness: 4 nm), a guide layer 6 made of $Al_{0.55}Ga_{0.45}As$ (film thickness: 20 nm), a cladding layer 7 made of p-type $(Al_{0.7}Ga_{0.3})_{0.51}In_{0.49}P$ (film thickness: 0.2 μm), an etch stop layer 8 made of p-type GaInP, a cladding layer 9 made of p-type $(Al_{0.7}Ga_{0.3})_{0.51}In_{0.49}P$ (film thickness: 1.4 μm), and a contact layer 10 (film thickness: 0.2 μm) made of p-type GaAs, in this stated order. Note that, in the quantum well active layer 5, the film thickness of the well layer 5b is adjusted so that the light emission wavelength is 760 nm to 790 nm. The film thickness is about 3 nm to 4 nm.

Figure 1B:
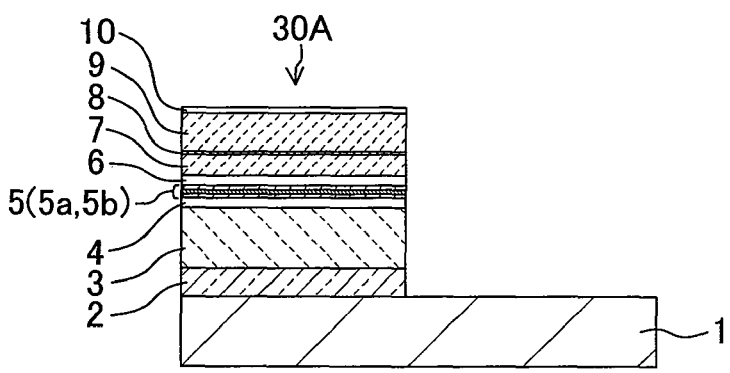

Next, as shown in FIG. 1B, the buffer layer 2, the cladding layer 3, the guide layer 4, the quantum well active layer 5, the guide layer 6, the cladding layer 7, the etch stop layer 8, the cladding layer 9, and the contact layer 10 that are present on regions other than a region where the first semiconductor laser device 30A is to be formed are removed by a photolithography technique and an etching technique.

Figure 1C:
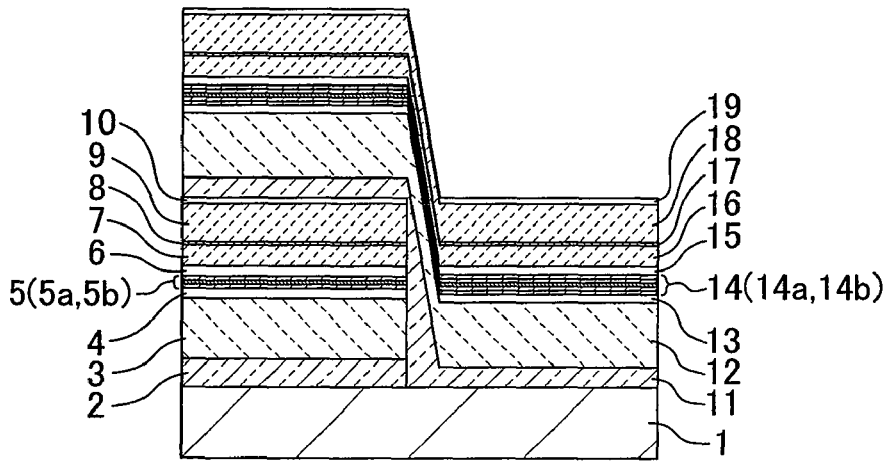

Next, as shown in FIG. 1C, a crystal growing device (e.g., MOCVD, etc.) is used to deposit, on an entire surface of the substrate 1, a buffer layer 11 made of n-type GaAs (film thickness: 0.5 μm), a cladding layer 12 made of n-type $(Al_{0.7}Ga_{0.3})_{0.51}In_{0.49}P$ (film thickness: 2.0 μm), a guide layer 13 made of $(Al_{0.55}Ga_{0.45})_{0.51}In_{0.49}P$, a quantum well active layer 14 including a well layer 14b made of GaInP (well number: 3) and a barrier layer 14a made of $(Al_{0.55}Ga_{0.45})_{0.51}In_{0.49}P$, a guide layer 15 made of $(Al_{0.55}Ga_{0.45})_{0.51}In_{0.49}P$ (film layer 16 made of p-type $(Al_{0.7}Ga_{0.3})_{0.51}In_{0.49}P$ (film thickness: 0.2 μm), an etch stop layer 17 made of p-type GaInP, a p-type cladding layer 18 made of $(Al_{0.7}Ga_{0.3})_{0.51}In_{0.49}P$ (film thickness: 1.4 μm), and a contact layer 19 made of p-type GaAs (film thickness: 0.2 μm), in this stated order. Note that, in the quantum well active layer 14, the film thickness or strain amount of the well layer 14b is adjusted so that the light emission wavelength is 650 nm to 670 nm.

Figure 1D:
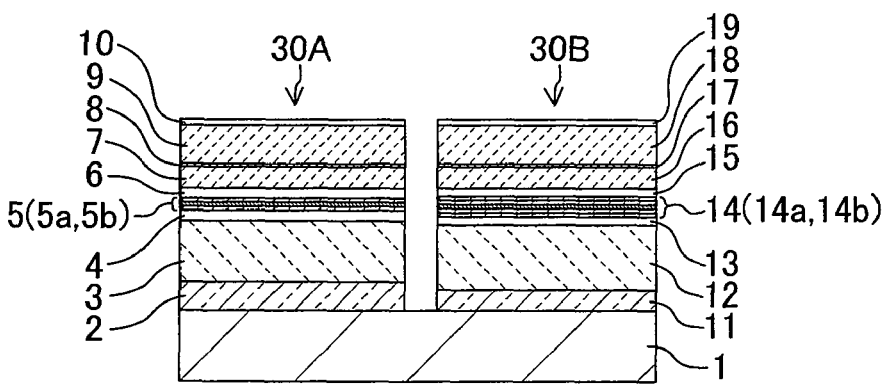

Next, as shown in FIG. 1D, as in the step of FIG. 1B, the buffer layer 11, the cladding layer 12, the guide layer 13, the quantum well active layer 14, the guide layer 15, the cladding layer 16, the etch stop layer 17, the cladding layer 18, and the contact layer 19 that are present in regions other than a region where the second semiconductor laser device 30B is to be formed are removed by a photolithography technique and an etching technique. Thereby, as shown in FIG. 1D, two multilayer structures are formed, being spaced from each other.

Next, as shown in FIG. 2A, a pattern for selectively diffusing Zn is formed in the vicinity of front and rear facets of resonators of the first semiconductor laser device 30A and the second semiconductor laser device 30B by a photolithography technique. Specifically, an opening is formed in a mask (not shown) in the vicinity of each facet, and a Zn diffusion source (not shown) and a cap film (not shown) are formed in this stated order. Thereafter, a thermal treatment is performed in a nitrogen atmosphere at 570° C. so that Zn is introduced into both the quantum well active layers 5 and 14 simultaneously, leading to average composition. Thereby, a facet window structure 20 is fabricated.

Next, as shown in FIG. 2B, a striped pattern (not shown) is formed on the contact layer 10 included in the first semiconductor laser device 30A and the contact layer 19 included in the second semiconductor laser device 30B using a photolithography technique, and the cladding layer 9 and the contact layer 10, and the cladding layer 18 and the contact layer 19 are removed by etching to expose upper surfaces of the etch stop layers 8 and 17. Thereby, a ridge-shaped structure is fabricated. A fabricated ridge portion 21 is used so as to implant carriers into the quantum well active layers 5 and 14 and confine light in a lateral direction. In this step, preferably, a common mask pattern is formed on both the contact layers 10 and 19, which are then simultaneously etched so as to simplify the fabrication process.

Next, as shown in FIG. 2C, a current blocking layer 22 is fabricated in a manner that allows only an upper surface of the ridge portion 21 to be open. The current blocking layer 22 is often made of a semiconductor layer, but may be made of an insulating film having less light absorption. For example, if a SiN film is used, the number of times of crystal growth can be reduced, resulting in a reduction in cost.

Finally, as shown in FIG. 2D, the thickness of the wafer is decreased to about 100 μm (not shown) before ohmic electrodes 23 and 24 are fabricated on both the n side and the p side.

By the above-described steps, an integrated two-wavelength semiconductor laser device having the structure of FIG. 2D is fabricated.

Hereinafter, a characteristic feature of the structure of the integrated two-wavelength semiconductor laser device of this embodiment will be specifically described.

Figure 3B:
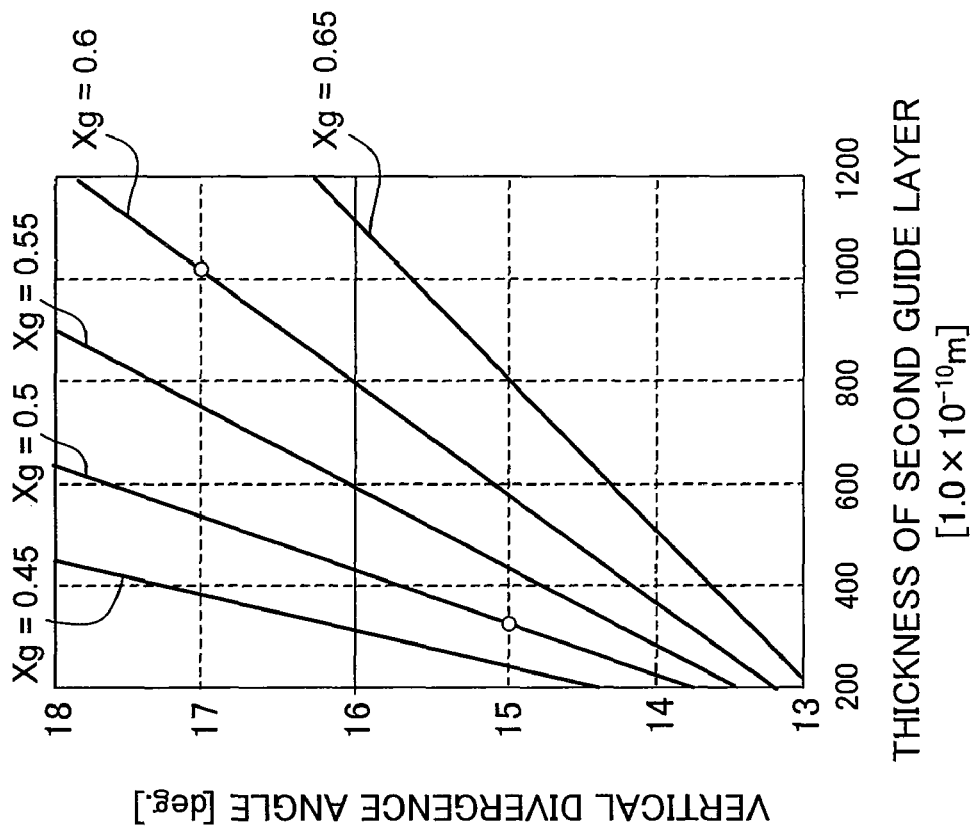
FIG. 3B is a diagram showing a relationship between the film thickness of a guide layer and the half width at half maximum in the vertical direction (vertical divergence angle), for the Al molar ratio (Xb) of a barrier layer or the Al molar ratio (Xg) of guide layers of a second semiconductor laser device.
Figure 3A:
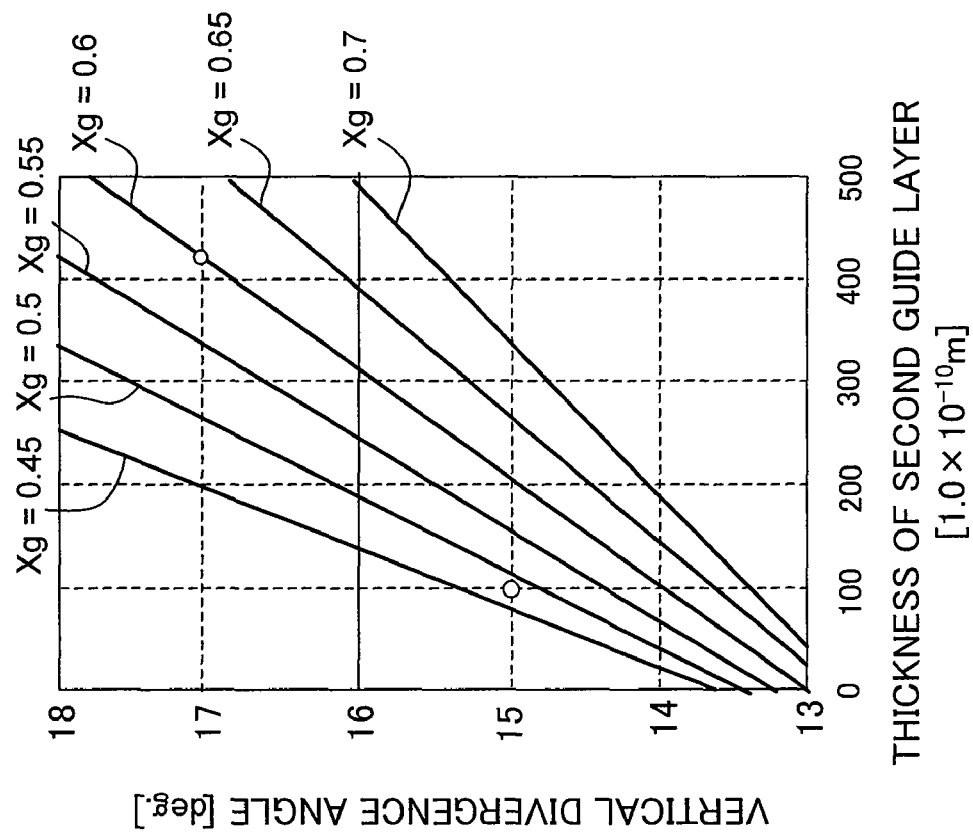
FIG. 3A is a diagram showing a relationship between the film thickness of a guide layer and the half width at half maximum in the vertical direction (vertical divergence angle), for the Al molar ratio (Xb) of a barrier layer or the Al molar ratio (Xg) of guide layers of a first semiconductor laser device.

FIG. 3A shows a relationship between the film thickness of the guide layer 6 and the half width at half maximum in the vertical direction (vertical divergence angle), for the Al molar ratio (Xb) of the barrier layer 5a or the Al molar ratio (Xg) of the guide layers 4 and 6 of the first semiconductor laser device 30A. Note that it is assumed in FIG. 3A that Xb and Xg are equal to each other and the film thicknesses of the guide layers 4 and 6 are equal to each other.

As shown in FIG. 3A, as Xb and Xg increase, the refractive index decreases, so that light confinement in the vertical direction in the quantum well active layer decreases, and therefore, the vertical divergence angle decreases. For a semiconductor laser device included in a pickup device for a writable and readable optical disc, a vertical divergence angle of less than 18° is strongly required so as to increase the radiative recombination efficiency of the optical system. Conversely, when the vertical divergence angle is narrow, light confinement at the light emitting facet is poor, so that the spot size of light cannot be sufficiently narrowed by the lens of the optical pickup device. In this case, the resolution of adjacent pieces of pit information on an optical disc is likely to decrease. Thus, the vertical divergence angle required by a semiconductor laser device included in a pickup device for a writable and readable optical disc is 14° to 18°, preferably about 16°. If the lower and upper limits of the vertical divergence angle are designed to be 15° and 17°, respectively, taking variations during manufacture into consideration, then when the values of Xb and Xg are set to be within the range of 0.47 to 0.60 as described below, the film thickness of the guide layer 6 is 10 nm to 43 nm. In this regard, when the film thickness of the guide layer 6 is large, it takes a long time for impurity diffusion to reach the quantum well active layer 5, so that the impurity concentration of the cladding layer 7 made of p-type AlGaInP disadvantageously becomes excessive. Therefore, it is known that the upper limit of the guide layer 6 is several tens of nanometers. The film thickness of the guide layer 6 of this embodiment can be easily caused to be lower than such an upper limit.

Next, FIG. 3B shows a relationship between the film thickness of the guide layer 15 and the half width at half maximum in the vertical direction (vertical divergence angle) for the Al molar ratio (Xb) of the barrier layer 14a or the Al molar ratio (Xg) of the guide layers 13 and 15 of the second semiconductor laser device 30B. Note that it is assumed in FIG. 3B that Xb and Xg are equal to each other and the film thicknesses of the guide layers 13 and 15 are equal to each other.

As shown in FIG. 3B, as Xb and Xg increase, the refractive index decreases, so that light confinement in the vertical direction in the quantum well active layer decreases, and therefore, the vertical divergence angle decreases. For a semiconductor laser device included in a pickup device for a writable and readable optical disc, a vertical divergence angle of less than 18° is strongly required so as to increase the radiative recombination efficiency of the optical system. Conversely, when the vertical divergence angle is narrow, light confinement at the light emitting facet is poor, so that the spot size of light cannot be sufficiently narrowed by the lens of the optical pickup device. In this case, the resolution of adjacent pieces of pit information on an optical disc is likely to decrease. Thus, the vertical divergence angle required by a semiconductor laser device included in a pickup device for a writable and readable optical disc is 14° to 18°, preferably about 16°. If the lower and upper limits of the vertical divergence angle are designed to be 15° and 17°, respectively, taking variations during manufacture into consideration, then when the values of Xb and Xg are set to be within the range of 0.5 to 0.6 as described below, the film thickness of the guide layer 15 is 30 nm to 100 nm. In the DVD semiconductor laser device, the vertical divergence angle is more likely to be narrow due to a facet window structure described below than the CD semiconductor laser device is. Therefore, since the vertical divergence angle of the device is adjusted by the film thicknesses of the guide layers 13 and 15, the film thickness of the guide layer 15 is not particularly limited, but may be set within the above-described film thickness range.

Figure 4A:
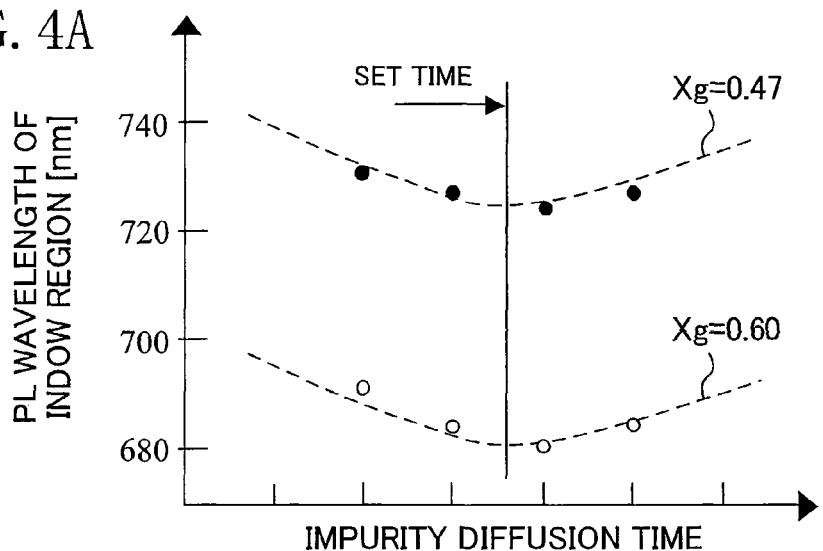
FIG. 4A is a diagram showing a relationship between the peak wavelength (PL wavelength) of an emission spectrum in a window region of the first semiconductor laser device by a photoluminescence (PL) technique or a cathode luminescence technique, and the diffusion time of an impurity, and a relationship between the PL wavelength, and the Al molar ratio (Xb) of the barrier layer and the Al molar ratio (Xg) of the guide layers.

FIG. 4A shows a relationship between the peak wavelength (PL wavelength) of an emission spectrum in the window region (the facet window structure 20) of the first semiconductor laser device 30A by a photoluminescence (PL) technique or a cathode luminescence technique, and the diffusion time of the impurity, and a relationship between the PL wavelength, and the Al molar ratio (Xb) of the barrier layer 5a and the Al molar ratio (Xg) of the guide layers 4 and 6. Note that it is assumed in FIG. 4A that Xb and Xg are equal to each other.

Figure 5:
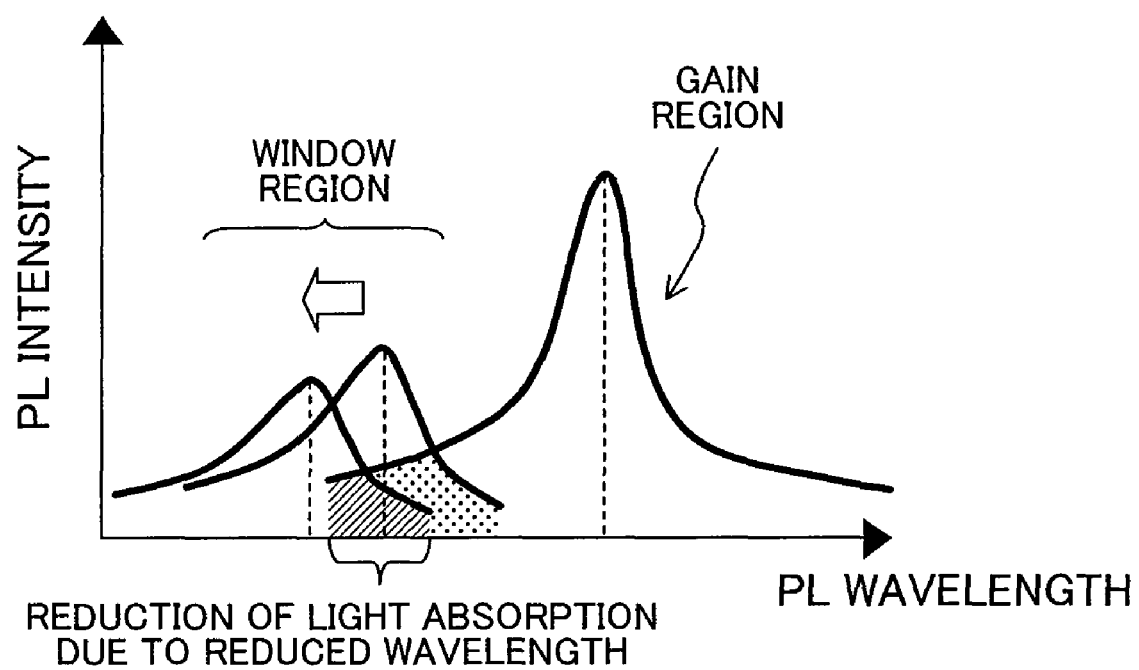
FIG. 5 is a diagram showing a relationship between a PL waveform and light absorption in the window region and a gain region in the first embodiment of the present invention.
Figure 11A:
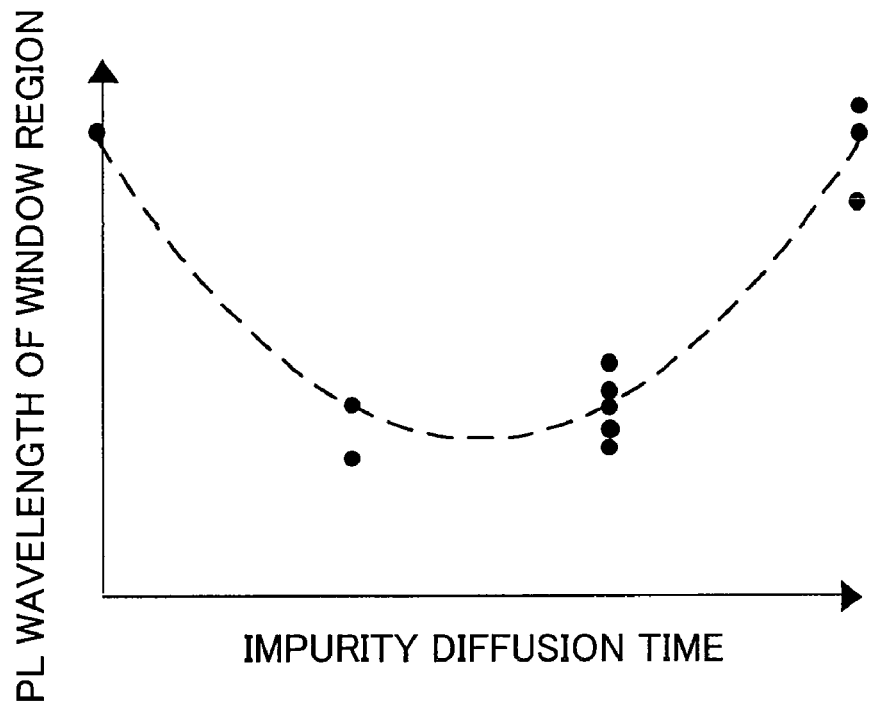
FIGS. 11A and 11B are diagrams showing results of measurement of the wavelength of photoluminescence (PL) light after a window region is irradiated with excited light.
Figure 11B:
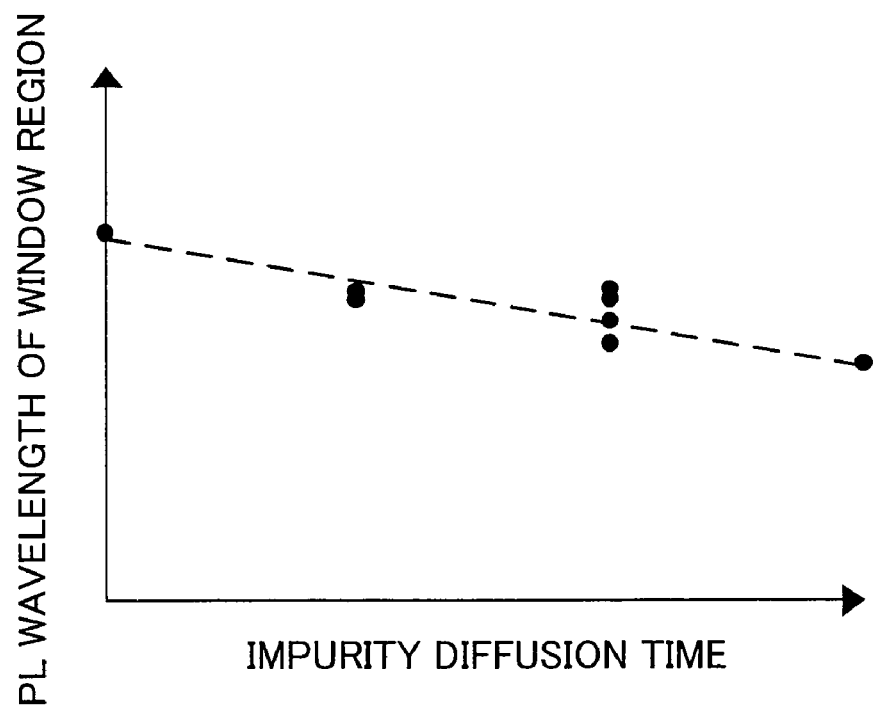

As described above with reference to FIG. 11A, as the impurity diffusion time increases, the PL wavelength of the window region conversely tends to increase, so that light absorption in the window region increases. In order to reduce the light absorption to improve the COD level (increase the light output), it is effective to increase a difference between the Al molar ratio of the well layer 5b of the quantum well active layer 5 and the Al molar ratio of the barrier layer 5a or the guide layers 4 and 6. A reason for this is considered to be that when the quantum well active layer 5 made of AlGaAs mixed crystal is caused to have average composition due to Zn, the AlGaAs mixed crystal comes to have a larger Al molar ratio, and therefore, the PL wavelength decreases (the band gap increases), whereby the light absorption of the window region can be reduced as shown in FIG. 5. The Al molar ratio of the AlGaAs mixed crystal caused to have average composition in the window region is preferably increased by reducing the film thickness of the well layer 5b having the lowest molar ratio and causing the film thickness of the barrier layer 5a to be larger than that of the well layer 5b. As described above, since the oscillation wavelength is set to be 760 nm to 790 nm in the first semiconductor laser device 30A, the Al molar ratio of the well layer 5b included in the quantum well active layer 5 is preferably 0.04 or less. More preferably, GaAs having an Al molar ratio of zero is employed. When the well layer 5b is made of GaAs, the film thickness is 4 nm or less. Therefore, as described below, even if the peak Zn concentration of the quantum well active layer 5 is $2\times10^{19}/cm^3$ or less, average composition can be sufficiently achieved.

Figure 4B:
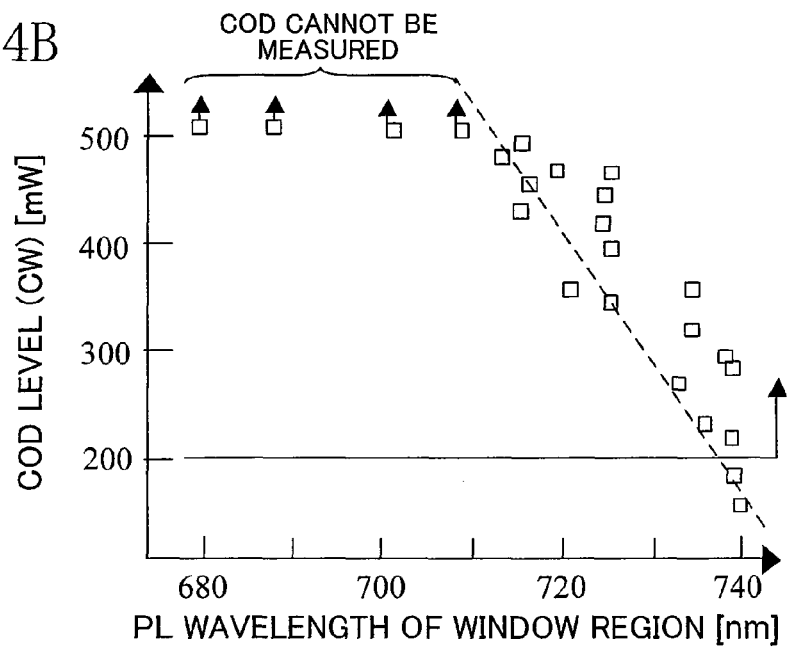
FIG. 4B is a diagram showing a relationship between the PL wavelength and a COD level (CW) in the window region of the first semiconductor laser device.

FIG. 4B shows a relationship between the PL wavelength and the COD level (CW) in the window region (the facet window structure 20) of the first semiconductor laser device 30A. Note that the COD level was measured with an operation current of 600 mA or less.

As can be seen from FIG. 4B, the COD level (CW) tends to decrease with an increase in the PL wavelength in the window region. The PL wavelength in the window region is preferably 730 nm or less so as to stably achieve a COD light output of 200 mW or more. The PL wavelength in the window region is preferably 710 nm or less so as to eliminate COD when the operation current is within the range of 600 mA or less. The absence of COD when the operation current is 600 mA or less, indicates that a light output of 500 mW or more can be achieved.

Also, since the mutual diffusion of constituent elements at interfaces between the well layer 5b, and the barrier layers 5a and the guide layers 4 and 6 located on both sides of the well layer 5b occurs within about several nanometers, the peak wavelength is substantially determined by the band gaps of these average compositions as shown in FIG. 4A above. When the well layer 5b is made of GaAs, the PL wavelength of 730 nm corresponds to a case where all of the barrier layer 5a and the guide layers 4 and 6 have the same film thickness as that of the well layer 5b and have an Al molar ratio of 0.47. The PL wavelength of 710 nm corresponds to a case where all of the barrier layer 5a and the guide layers 4 and 6 have the same film thickness as that of the well layer 5b and an Al molar ratio of 0.53. Also, when the film thickness of the well layer 5b is smaller than that of the barrier layer 5a and the guide layers 4 and 6, the Al molar ratio of the barrier layer 5a and the guide layers 4 and 6 may be smaller than the above-described value. On the other hand, if the Al molar ratio of the barrier layer 5a and the guide layers 4 and 6 is high, the diffusion of the impurity is accelerated to facilitate formation of mixed crystal. In this case, however, since a larger amount of oxygen is taken in, the crystallinity disadvantageously decreases or the evenness of the quantum well interface deteriorates. Therefore, the Al molar ratio of the barrier layer 5a and the guide layers 4 and 6 is preferably 0.6 or less. Specifically, when the Al molar ratio of the barrier layer 5a and the guide layers 4 and 6 was set to be higher than 0.6, it was found that COD occurs, so that the temperature characteristics of the device tend to deteriorate. A reason for this is considered to be that since the uniformity of implanted carriers decreases or the AlGaAs layer containing a large amount of highly reactive Al has a reduced level of crystallinity, the use of these in the active layer causes a device deterioration due to a crystal defect existing therein, the impurity level or the like. Thus, the Al molar ratio of the barrier layer 5a and the guide layers 4 and 6 is preferably higher than 0.47 and lower than or equal to 0.60. More preferably, the Al molar ratio is higher than 0.50 and lower than or equal to 0.60, since a required impurity concentration can be reduced.

Figure 4C:
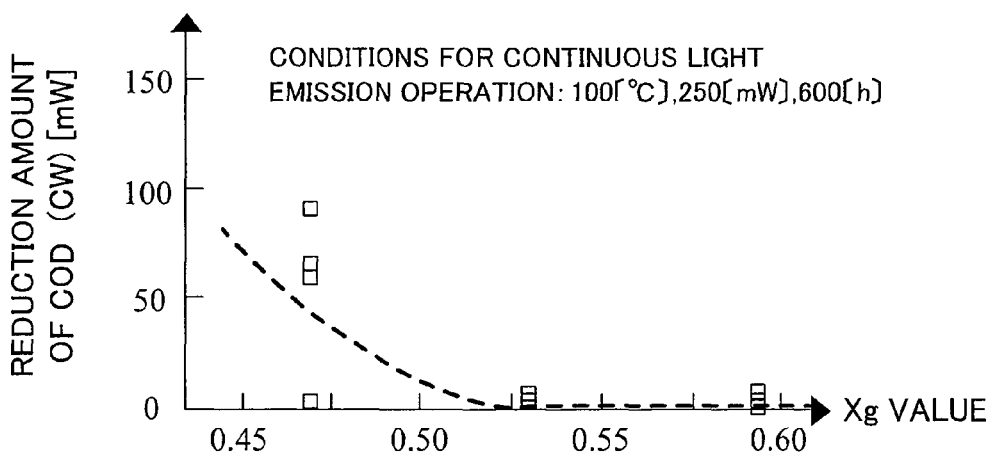
FIG. 4C is a diagram showing a relationship between the Al molar ratio (Xg) of the barrier layer and the guide layers and a reduction amount in COD level (CW) after a continuous light emission operation in the first embodiment.

FIG. 4C shows a relationship between the Al molar ratio (Xg) of the barrier layer 5a and the guide layers 4 and 6 and a reduction amount in COD level (CW) after a continuous light emission operation in the first embodiment. Note that the vertical axis of the graph indicates a reduction amount in COD level after a 600-hour continuous operation at 100° C. and 250 mW (CW). Evaluation of COD was performed with respect to a plurality of samples prepared under the same conditions before and after the continuous operation, and a difference between the average values was considered as a reduction in COD. The reduction amount in COD also means a value obtained by subtracting a COD value after the continuous light emission operation from an initial COD value.

Here, if the COD level is significantly reduced during a desired continuous light emission operation, the reliability of the device is impaired. Therefore, it is important to improve the initial COD level and, in addition, suppress the reduction amount of COD. Since the initial COD level at the PL wavelength of 730 nm is 300 mW or more, the reduction amount of the COD level is desirably 100 mW or less so as to stably obtain a light output of 200 mW or more.

As can be seen from FIG. 4C, when the Al molar ratio of the barrier layer 5a and the guide layers 4 and 6 is 0.47, the reduction amount of COD is 100 mW or less and a stable operation of 200 mW or more is obtained. Moreover, when the Al molar ratio is 0.53 or more, substantially no reduction in COD level occurs and a more stable continuous light emission operation can be more preferably achieved.

Figure 6A:
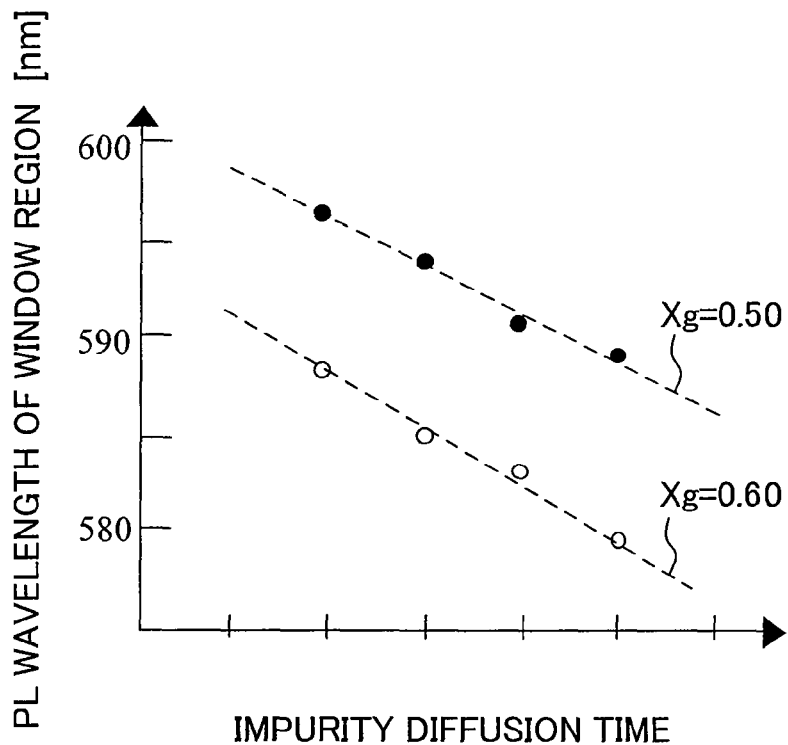
FIG. 6A is a diagram showing a relationship between the peak wavelength (PL wavelength) of an emission spectrum in a window region of a second semiconductor laser device by a photoluminescence (PL) technique or a cathode luminescence technique, and the diffusion time of an impurity, and a relationship between the PL wavelength, and the Al molar ratio (Xb) of a barrier layer and the Al molar ratio (Xg) of guide layers.

Next, FIG. 6A shows a relationship between the peak wavelength (PL wavelength) of an emission spectrum in the window region (the facet window structure 20) of the second semiconductor laser device 30B by a photoluminescence (PL) technique or a cathode luminescence technique, and the diffusion time of the impurity, and a relationship between the PL wavelength, and the Al molar ratio (Xb) of the barrier layer 14a and the Al molar ratio (Xg) of the guide layers 13 and 15. Note that it is assumed in FIG. 6A that Xb and Xg are equal to each other.

As shown in FIG. 6A, in the case of the second semiconductor laser device 30B, as is different from the first semiconductor laser device 30A, as the impurity diffusion time increases, the PL wavelength of the window region monotonically decreases, so that the light absorption in the window region decreases. When the window region of the first semiconductor laser device 30A and the window region of the second semiconductor laser device 30B are simultaneously formed, it is not possible to increase the impurity diffusion time without limitation, and the impurity diffusion time is preferably set not to exceed a time that allows the PL wavelength of the window region of the first semiconductor laser device 30A to have a minimum value. This is because a stable COD level is achieved by reducing a risk that Zn in the window region is further diffused due to a thermal treatment in a fabrication process after formation of the window region or heat generation during a continuous light emission operation of the device, or the like, so that the PL wavelength of the window region increases (the band gap becomes narrower), and therefore, light absorption in the window region increases. Moreover, as is similar to the first semiconductor laser device 30A, it is effective to increase a different in Al molar ratio between the well layer 14b of the quantum well active layer 14, and the barrier layer 14a and the guide layers 13 and 15 so as to reduce light absorption, thereby improving the COD level (increasing light output).

Figure 6B:
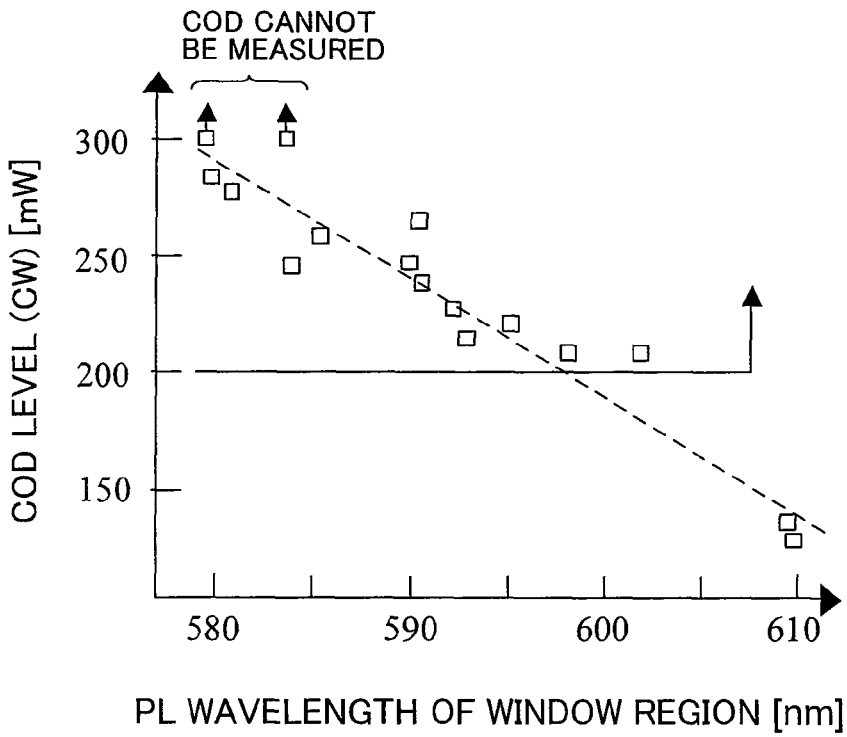
FIG. 6B is a diagram showing a relationship between the PL wavelength in the window region of the second semiconductor laser device, and the COD level (CW).

FIG. 6B shows a relationship between the PL wavelength in the window region (the facet window structure 20) of the second semiconductor laser device 30B, and the COD level (CW).

As can be seen from FIG. 6B, as is similar to the first semiconductor laser device 30A, the COD level (CW) tends to decrease with an increase in the PL wavelength of the window region. The PL wavelength of the window region is preferably 595 nm or less so as to stably achieve a COD light output of higher than 200 mW. In this case, the Al molar ratio of the barrier layer 14a and the guide layers 13 and 15 is preferably 0.50 or more in view of FIG. 6A. Also, as is similar to the first semiconductor laser device 30A, when the Al molar ratio of the barrier layer 14a and the guide layers 13 and 15 was set to be higher than 0.6, it was found that temperature characteristics of the device tends to deteriorate. Therefore, the Al molar ratio of the barrier layer 14a and the guide layers 13 and 15 is preferably 0.6 or less. Thus, the Al molar ratio of the barrier layer 14a and the guide layers 13 and 15 is preferably 0.50 or more and 0.6 or less.

Next, impurity diffusion for forming the facet window structure 20 in the first and second semiconductor laser devices 30A and 30B will be described.

Initially, the upper limit of the thermal diffusion temperature of the impurity is preferably set to be 650° C. that is a crystal growth temperature of AlGaInP mixed crystal so as to avoid a problem that Zn particularly in the cladding layers 16 and 18 made of AlGaInP layer included in the second semiconductor laser device 30B is diffused in the quantum well active layer 14 in a gain region that contributes to laser oscillation other than the window region, so that characteristics of the second semiconductor laser device 30B are deteriorated. On the other hand, the lower limit of the impurity diffusion temperature is preferably set so as to prevent an excessive increase in the impurity diffusion time, which reduces the productivity.

Here, the peak Zn concentration of the quantum well active layer in this embodiment is about $8 \times 10^{18}/cm^3$ in the quantum well active layer 5 of the first semiconductor laser device 30A, and about $5 \times 10^{18}/cm^3$ in the quantum well active layer 14 of the second semiconductor laser device 30B. In this regard, it was found that when the peak Zn concentration exceeds $2 \times 10^{19}/cm^3$ and $1 \times 10^{19}/cm^3$ in the first semiconductor laser device 30A and the second semiconductor laser device 30B, respectively, light absorption due to free carriers increases, so that the COD level decreases. In other words, when a window structure is formed in a two-wavelength laser, the impurity concentrations of the quantum well active layers of the infrared laser and the red laser are preferably controlled to $2 \times 10^{19}/cm^3$ or less and $1 \times 10^{19}/cm^3$ or less, respectively. In this case, mutual diffusion of the constituent elements is a phenomenon that occurs within the range of not more than about several nanometers. Therefore, the film thicknesses of the well layer and the barrier layer included in the quantum well active layer are preferably limited to the range of several nanometers so as to achieve average composition. On the other hand, the lower limit of the peak Zn concentration may be about $1 \times 10^{18}/cm^3$ above which the average composition of the quantum well structure occurs (see, for example, J. W. Lee and W. D. Laiding: J. Electron. Mater. 13 (1984) 147).

Also, when Zn is diffused in both the first semiconductor laser device 30A and the second semiconductor laser device 30B simultaneously, Zn diffusion is more suppressed in the first semiconductor laser device 30A in which the quantum well active layer 5 is made of AlGaAs mixed crystal than in the second semiconductor laser device 30B. Therefore, it is found that the peak Zn concentration of the quantum well active layer 5 of the first semiconductor laser device 30A tends to be larger than the peak Zn concentration of the quantum well active layer 14 of the second semiconductor laser device 30B.

In the two-wavelength semiconductor laser device, when the window structures of an infrared laser (the first semiconductor laser device 30A) and a red laser (the second semiconductor laser device 30B) are simultaneously formed, it is essential to use an AlGaInP layer as a cladding layer. However, as described above, the impurity concentration of the quantum well active layer of the infrared laser can be set to be higher than the impurity concentration of the quantum well active layer of the red laser. Note that, in the infrared laser, the AlGaInP layer may be used as at least the cladding layer located on the quantum well active layer.

Next, a terminal end (Zn diffusion end) when Zn is diffused will be described.

The diffusion of Zn is caused to end in the cladding layer 3 of the first semiconductor laser device 30A and in the cladding layer 12 of the second semiconductor laser device 30B. This is because device leakage occurs if the Zn diffusion end reaches the buffer layers 2 and 11 made of n-type GaAs. Specifically, in this embodiment, a distance from the quantum well active layer 5 to the Zn diffusion end in the first semiconductor laser device 30A was about 0.5 μm, and a distance from the quantum well active layer 14 to the Zn diffusion end in the second semiconductor laser device 30B was about 0.7 μm. It was found that when Zn diffusion is performed in both the first semiconductor laser device 30A and the second semiconductor laser device 30B simultaneously, Zn diffusion is more suppressed in the first semiconductor laser device 30A than in the second semiconductor laser device 30B as described above, so that the Zn diffusion end tends to be shallower in the first semiconductor laser device 30A than in the second semiconductor laser device 30B.

Figure 7:
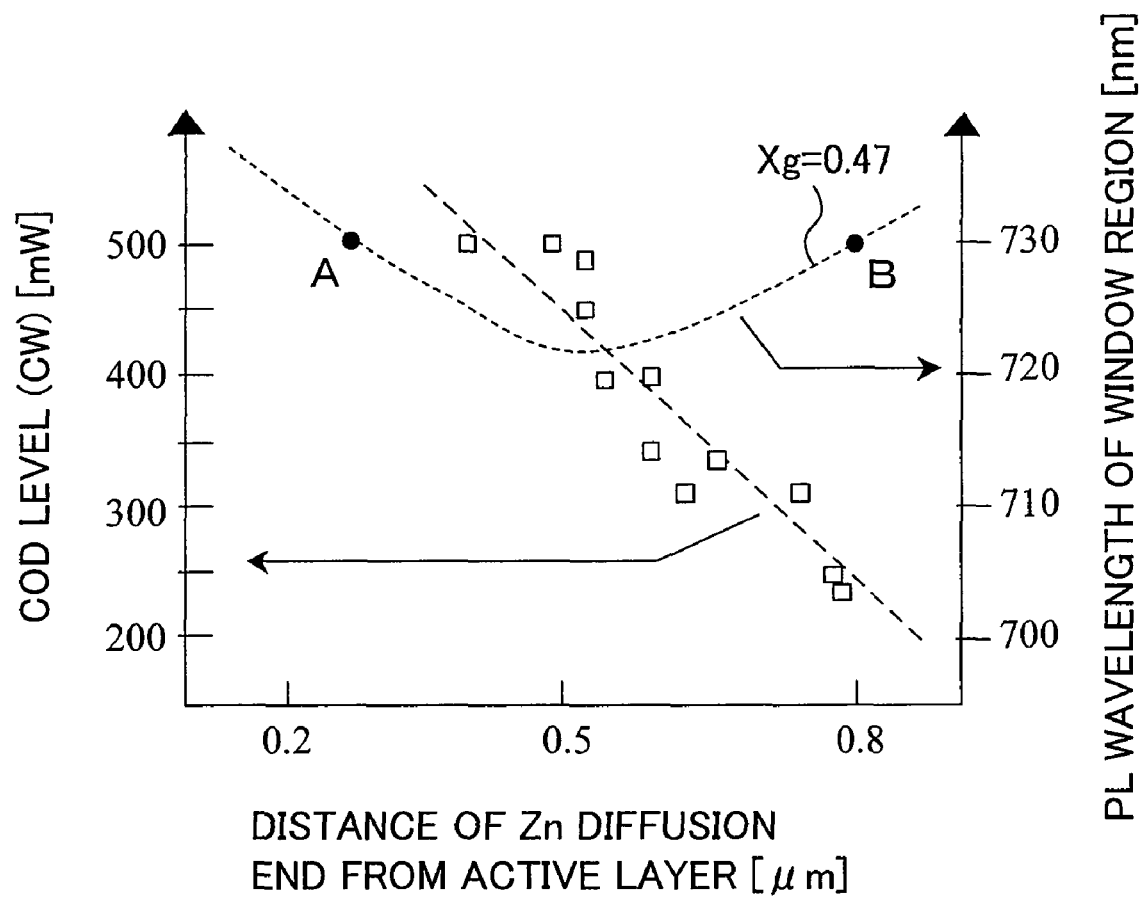
FIG. 7 is a diagram showing a relationship between a distance from a quantum well active layer to a Zn diffusion end in the first semiconductor laser device, and the COD level and the PL wavelength of the window region.

FIG. 7 shows a relationship between the distance from the quantum well active layer 5 to the Zn diffusion end in the first semiconductor laser device 30A, and the COD level and the PL wavelength of the window region.

As can be seen from FIG. 7, the COD level tends to decrease with an increase in the distance from the quantum well active layer 5 to the Zn diffusion end. A reason for this is considered to be that if the distance from the quantum well active layer 5 to the Zn diffusion end is larger than or equal to a certain value, the PL wavelength of the window region is large, so that light absorption in the window region increases, and the peak Zn concentration of the quantum well active layer 5 increases, so that free carrier absorption or the like increases. In FIG. 7, as indicated by A and B, the COD level changes even if the PL wavelength is the same. Therefore, the distance from the quantum well active layer 5 to the Zn diffusion end is an important parameter. The distance from the quantum well active layer 5 to the Zn diffusion end is preferably 0.8 μm or less so as to stably achieve a COD level of 200 mW (CW) or more.

In the integrated two-wavelength semiconductor laser device of the first embodiment of the present invention having the above-described characteristic features, the first and second semiconductor laser devices 30A and 30B can both have a CW light output exceeding 200 mW, and the window region can be formed in the first and second semiconductor laser devices 30A and 30B simultaneously, so that it can be manufactured by a simple fabrication process and with low cost. More specifically, the well layer 5b included in the first semiconductor laser device 30A (infrared laser) is made of GaAs having a film thickness of 4 nm or less. The film thickness of the barrier layer 5a is larger than that of the well layer 5b. The Al molar ratios Xg and Xb are more than 0.47 and 0.6 or less. The peak wavelength of an emission spectrum obtained from the facet window structure 20 of the quantum well active layer 5 by a photoluminescence technique or a cathode luminescence technique is 730 nm or less. In the facet window structure 20, the impurity concentration of the first semiconductor laser device 30A is larger than the impurity concentration of the second semiconductor laser device 30B. The impurity concentration of the second semiconductor laser device 30B is $1 \times 10^{19}/cm^3$ or less. Therefore, a high-power two-wavelength laser device can be achieved which has less carrier absorption and light absorption and has a facet window structure with excellent crystallinity.

—Variations—

Hereinafter, variations of the first embodiment will be described. Specifically, in the same compound semiconductor mixed crystal containing Al, the diffusion coefficient of Zn tends to increase as the Al molar ratio increases, and Zn diffusion is accelerated as the lattice constant of AlGaInP mixed crystal decreases. An example in which these characteristics are utilized to more quickly form the facet window structure 20 in the first semiconductor laser device 30A will be described.

If the Al molar ratios (Xg, Xb) of the guide layers 4 and 6 and the barrier layer 5a are less than 0.47 and 0.6 or less as described above, the Al molar ratios may increase in order of crystal growth from the substrate 1, i.e., the Al molar ratios x1, x2 and x3 of the guide layer 4, the barrier layer 5a and the guide layer 6 may increase in this stated order in the first semiconductor laser device 30A. Similarly, the Al molar ratios x4, x5 and x6 of the guide layer 13, the barrier layer 14a and the guide layer 15 may increase in this stated order in the second semiconductor laser device 30B. In this case, the Al molar ratios are decreased toward the substrate 1 so as to cause Zn diffusion to advance toward the substrate 1 during formation of the facet window structure 20. Thereby, Zn diffusion in the quantum well active layer 5 is more smoothly performed than when the layers have the same Al molar ratio, preferably resulting in promotion of average composition.

If the Al molar ratio of the guide layer 6 is within the above-described range, the guide layer 6 may not be a single layer. Specifically, when the guide layer 6 includes a plurality of layers having different Al molar ratios, the Al molar ratios of the layers are preferably decreased toward the substrate 1 as described above.

Also, if the Al molar ratios of the cladding layers 7 and 9 in the first semiconductor laser device 30A are set to be larger than the Al molar ratios of the cladding layers 16 and 18 in the second semiconductor laser device 30B, Zn diffusion into the quantum well active layer 5 can be accelerated in the first semiconductor laser device 30A.

Also, if the lattice constants of the cladding layers 7 and 9 in the first semiconductor laser device 30A are set to be smaller than the lattice constants of the cladding layers 16 and 18 in the second semiconductor laser device 30B, Zn diffusion can be similarly accelerated in the first semiconductor laser device 30A.

Also, if the doping concentrations of the cladding layers 7 and 9 in the first semiconductor laser device 30A is set to be larger than the doping concentrations of the cladding layer 16 and 18 in the second semiconductor laser device 30B, Zn diffusion can be similarly accelerated in the first semiconductor laser device 30A. In this case, taking into consideration Zn diffusion into the quantum well active layer 5 in a gain region, the Zn concentrations of the cladding layers 7 and 9 in the first semiconductor laser device 30A and the cladding layers 16 and 18 in the second semiconductor laser device 30B are preferably $1 \times 10^{17}/cm^3$ or more and $1 \times 10^{18}/cm^3$ or less.

Although it has been described in the embodiment above that impurity diffusion is performed in the first semiconductor laser device 30A and the second semiconductor laser device 30B simultaneously for formation of the facet window structure 20, impurity diffusion may be performed in the first semiconductor laser device 30A and the second semiconductor laser device 30B separately. In this case, the number of fabrication steps increases. However, impurity diffusion may be separately performed, particularly when the second semiconductor laser device 30B is caused to have higher power (improve the COD level) with priority.

Also, the integrated two-wavelength semiconductor laser device of this embodiment may be fabricated as separate semiconductor laser devices. In this case, low-cost and high-performance semiconductor laser devices for CDs and DVDs can be obtained by a simpler fabrication process.

Second Embodiment

Hereinafter, an integrated two-wavelength semiconductor laser device according to a second embodiment of the present invention and its fabricating method will be described.

FIGS. 8A to 8D and FIGS. 9A to 9C are cross-sectional views showing steps of fabricating the integrated two-wavelength semiconductor laser device of the second embodiment of the present invention in sequence. As in the first embodiment, it is hereinafter assumed that, for example, a two-wavelength semiconductor laser device is fabricated in which a first semiconductor laser device 30C that is, for example, a semiconductor laser for CDs (oscillation wavelength: 760 nm to 790 nm) and a second semiconductor laser device 30B that is, for example, a semiconductor laser for DVDs (oscillation wavelength: 650 nm to 670 nm) are monolithically integrated on a substrate.

Figure 8A:
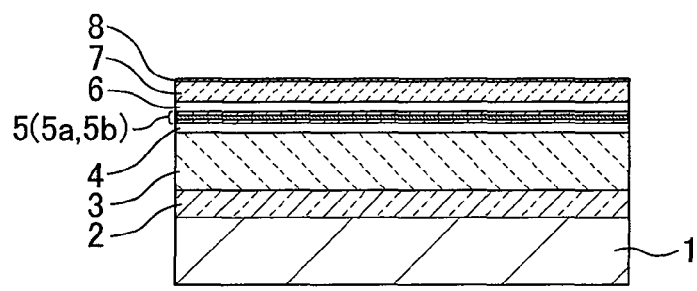
FIGS. 8A to 8D are cross-sectional views showing steps of fabricating an integrated two-wavelength semiconductor laser device according to a second embodiment of the present invention in sequence.

Initially, as shown in FIG. 8A, a crystal growing device (e.g., MOCVD, etc.) is used to deposit, on a substrate 1 made of n-type GaAs that is tilted by 10° in the [011] direction from the (100) plane, a buffer layer 2 made of n-type GaAs (film thickness: 0.5 μm), a cladding layer 3 made of n-type $(Al_{0.7}Ga_{0.3})_{0.51}In_{0.49}P$ (film thickness: 2.0 μm), a guide layer 4 made of $Al_{0.55}Ga_{0.45}As$ (film thickness: 20 nm), a quantum well active layer 5 including a well layer 5b made of GaAs (well number: 2) and a barrier layer 5a made of $Al_{0.55}Ga_{0.45}As$ (film thickness: 4 nm), a guide layer 6 made of $Al_{0.55}Ga_{0.45}As$ (film thickness: 20 nm), a cladding layer 7 made of p-type $(Al_{0.7}Ga_{0.3})_{0.51}In_{0.49}P$ (film thickness: 0.2 μm), and an etch stop layer 8 made of p-type GaInP, in this stated order. Note that, in the quantum well active layer 5, the film thickness of the well layer 5b is adjusted so that the light emission wavelength is 760 nm to 790 nm. In this step, as compared to the first embodiment, the cladding layer 9 made of p-type $(Al_{0.7}Ga_{0.3})_{0.51}In_{0.49}P$ (film thickness: 1.4 μm) and the contact layer 10 (film thickness: 0.2 μm) made of p-type GaAs are not deposited.

Figure 8B:
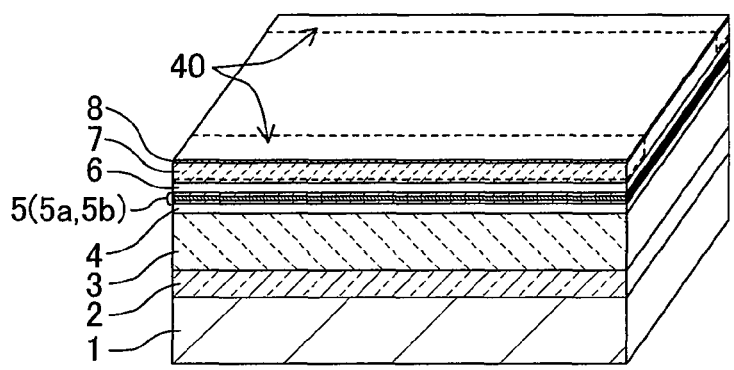

Next, as shown in FIG. 8B, Si ions are selectively implanted in the vicinity of front and rear facets of a resonator of the first semiconductor laser device 30C using a photolithography technique. Specifically, a mask (not shown) made of $SiO_2$ having an opening in the vicinity of the facet is used to implant Si ions at an acceleration voltage of about 50 keV to 150 keV and a dose of about $1 \times 10^{13}/cm^2$ to $1 \times 10^{15}/cm^2$, thereby forming a portion of a facet window structure 40.

Figure 8C:
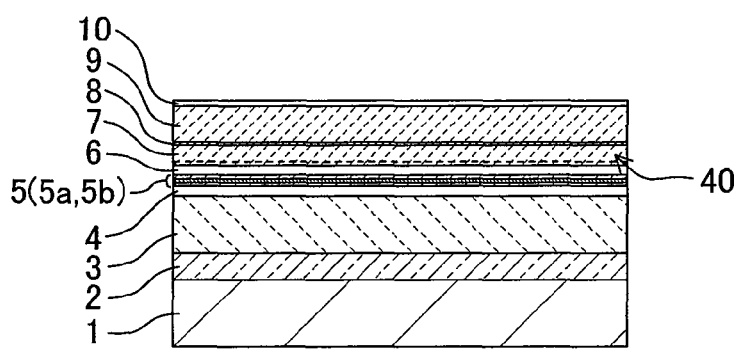

Next, as shown in FIG. 8C, a crystal growing device (e.g., MOCVD, etc.) is used to deposit a cladding layer 9 made of p-type $(Al_{0.7}Ga_{0.3})_{0.51}In_{0.49}P$ (film thickness: 1.4 µm) and a contact layer 10 made of p-type GaAs (film thickness: 0.2 µm).

Figure 8D:
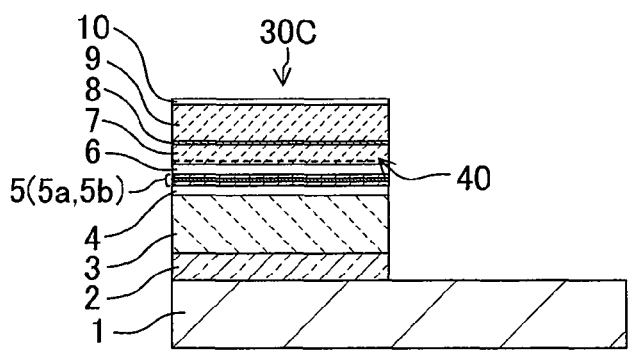
Figure 10A:
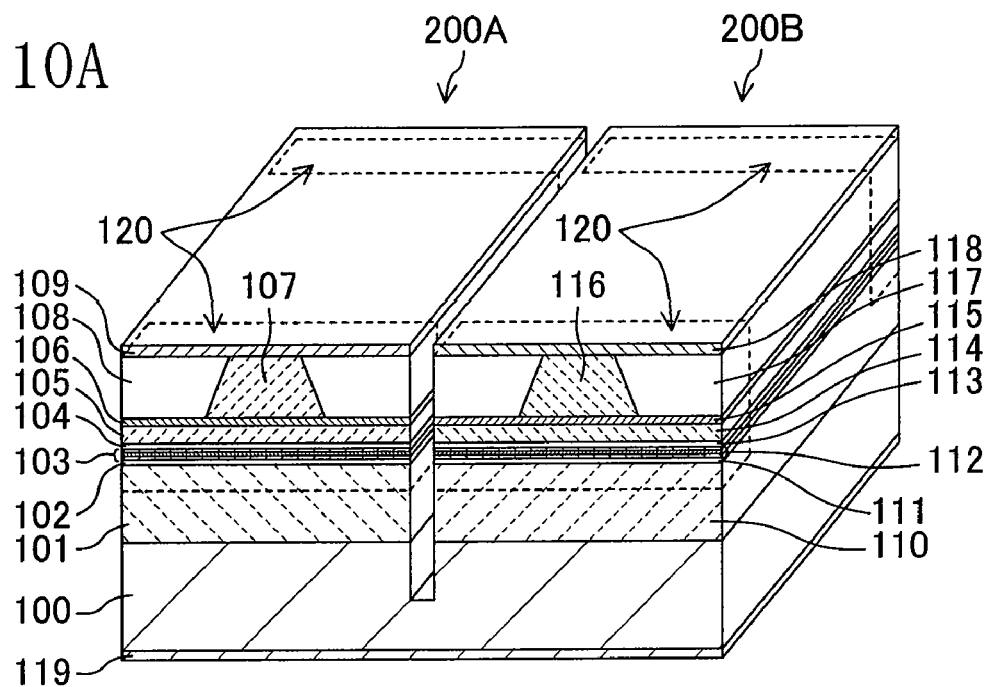
FIGS. 10A and 10B are diagrams showing structures of conventional integrated two-wavelength semiconductor laser devices.
Figure 10B:
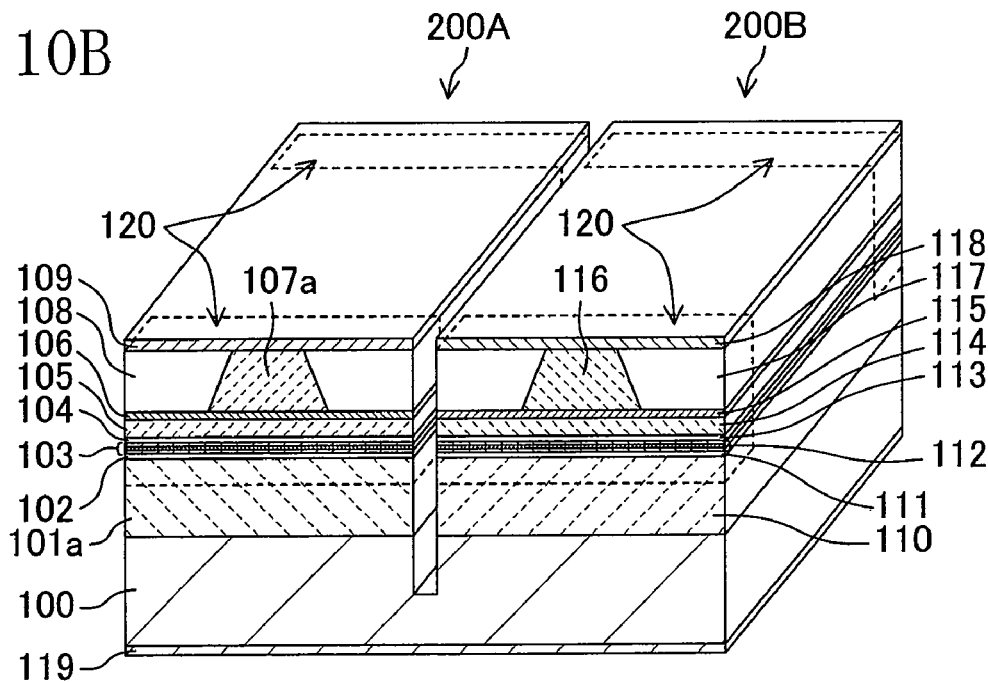

Next, as shown in FIG. 8D, the buffer layer 2, the cladding layer 3, the guide layer 4, the quantum well active layer 5, the guide layer 6, the cladding layer 7, the etch stop layer 8, the cladding layer 9, and the contact layer 10 that are present on regions other than a region where the first semiconductor laser device 30C is to be formed are removed by a photolithography technique and an etching technique.

Next, as shown in FIG. 9A, a crystal growing device (e.g., MOCVD, etc.) is used to deposit, on an entire surface of the substrate 1, a buffer layer 11 made of n-type GaAs (film thickness: 0.5 µm), a cladding layer 12 made of n-type $(Al_{0.7}Ga_{0.3})_{0.51}In_{0.49}P$ (film thickness: 2.0 µm), a guide layer 13 made of $(Al_{0.55}Ga_{0.45})_{0.51}In_{0.49}P$, a quantum well active layer 14 including a well layer 14b made of GaInP (well number: 3) and a barrier layer 14a made of $(Al_{0.55}Ga_{0.45})_{0.51}In_{0.49}P$, a guide layer 15 made of $(Al_{0.55}Ga_{0.45})_{0.51}In_{0.49}P$, a p-type cladding layer 16 made of $(Al_{0.7}Ga_{0.3})_{0.51}In_{0.49}P$ (film thickness: 0.2 µm), an etch stop layer 17 made of p-type GaInP, a p-type cladding layer 18 made of $(Al_{0.7}Ga_{0.3})_{0.51}In_{0.49}P$ (film thickness: 1.4 µm), and a contact layer 19 made of p-type GaAs (film thickness: 0.2 µm). Note that, in the quantum well active layer 14, the film thickness or strain amount of the well layer 14b is adjusted so that the light emission wavelength is 650 nm to 670 nm.

Next, as shown in FIG. 9B, as in the step of FIG. 8D, the buffer layer 11, the cladding layer 12, the guide layer 13, the quantum well active layer 14, the guide layer 15, the cladding layer 16, the etch stop layer 17, the cladding layer 18, and the contact layer 19 that are present in regions other than a region where the second semiconductor laser device 30B is to be formed are removed by a photolithography technique and an etching technique. Thereby, as shown in FIG. 9B, two multilayer structures are formed, being spaced from each other.

Next, as shown in FIG. 9C, a pattern for selectively diffusing Zn is formed only in the vicinity of front and rear facets of a resonator of the second semiconductor laser device 30B using a photolithography technique. Specifically, an opening is formed in a mask (not shown) in the vicinity of each facet, and a Zn diffusion source (not shown) and a cap film (not shown) are formed in this stated order. Thereafter, a thermal treatment is performed in a nitrogen atmosphere at 570° C. so that Si implanted in the first semiconductor laser device 30C is introduced into the quantum well active layer 5 and Zn is introduced into the quantum well active layer 14 of the second semiconductor laser device 30B, leading to average composition. Thereby, facet window structures 40 and 20 are fabricated.

The subsequent steps are similar to those that have been described in the first embodiment with reference to FIGS. 2A to 2D. Thus, the integrated two-wavelength semiconductor laser device is fabricated. Note that the integrated two-wavelength semiconductor laser device of this embodiment and its fabricating method are different from those of the first embodiment only in an impurity (Zn, Si) diffused in the first semiconductor laser device (30A, 30C) and the method of fabricating the first semiconductor laser device.

In the integrated two-wavelength semiconductor laser device of the second embodiment of the present invention, the first and second semiconductor laser devices 30C and 30B can both have a CW light output exceeding 200 mW, and impurity diffusion in the window region can be performed in the first and second semiconductor laser devices 30C and 30B simultaneously, so it can be manufactured by a simple fabrication process and with low cost.

Also, the integrated two-wavelength semiconductor laser device of this embodiment may be fabricated as separate semiconductor laser devices. In this case, low-cost and high-performance semiconductor laser devices for CDs and DVDs can be obtained by a simpler fabrication process.

Note that the present invention is useful for an integrated high-power two-wavelength semiconductor laser device for emitting red light (oscillation wavelength 650-nm band) and infrared light (oscillation wavelength 780-nm band) that is used as a light source for a pickup of an optical disc device, a light source for other electronic devices and information processing devices, or the like, and its fabricating method.

What is claimed is:

1. A two-wavelength semiconductor laser device comprising a first semiconductor laser device and a second semiconductor laser device each having a window structure in a vicinity of an optical resonator facet, on a first-conductivity type single crystal semiconductor substrate, wherein
   the first semiconductor laser device includes at least a first-conductivity type first cladding layer, a first guide layer made of AlGaAs mixed crystal, a first quantum well active layer having a barrier layer made of AlGaAs mixed crystal, a second guide layer made of AlGaAs mixed crystal, and a second-conductivity type second cladding layer, sequentially formed on the semiconductor substrate,
   the second semiconductor laser device includes at least a first-conductivity type third cladding layer, a third guide layer made of AlGaInP mixed crystal, a second quantum well active layer having a barrier layer made of AlGaInP mixed crystal, a fourth guide layer made of AlGaInP mixed crystal, and a second-conductivity type fourth cladding layer, sequentially formed on the semiconductor substrate,
   at least the barrier layer included in the first quantum well active layer, the first guide layer, and the second guide layer each have an Al molar ratio of more than 0.47 and 0.60 or less,
   a peak concentration of a first impurity in the first quantum well active layer in the window structure of the first semiconductor laser device is higher than a peak concentration of a second impurity in the second quantum well active layer in the window structure of the second semiconductor laser device,
   the peak concentration of the second impurity is $1 \times 10^{18}/cm^3$ or more and $1 \times 10^{19}/cm^3$ or less,
   a diffusion end closer to the semiconductor substrate of the first impurity in the window structure of the first semiconductor laser device is located in the first cladding layer,
   a diffusion end closer to the semiconductor substrate of the second impurity in the window structure of the second semiconductor laser device is located in the third cladding layer, and
   a distance from the first quantum well active layer to the diffusion end closer to the semiconductor substrate of the first impurity is smaller than a distance from the second quantum well active layer to the diffusion end closer to the semiconductor substrate of the second impurity.

2. The two-wavelength semiconductor laser device of claim 1, wherein the barrier layer included in the first quantum well active layer, the first guide layer, and the second guide layer each have an Al molar ratio of 0.53 or more and 0.60 or less.

3. The two-wavelength semiconductor laser device of claim 1, wherein the second cladding layer and the fourth cladding layer are each made of AlGaInP mixed crystal.

4. The two-wavelength semiconductor laser device of claim 1, wherein the distance from the first quantum well active layer to the diffusion end closer to the semiconductor substrate of the first impurity is 0.8 µm or less.

5. The two-wavelength semiconductor laser device of claim 1, wherein
a first peak wavelength of a spectrum obtained from the window region in the first semiconductor laser device by a photoluminescence technique or a cathode luminescence technique is 730 nm or less, and
a second peak wavelength of a spectrum obtained from the window region in the second semiconductor laser device by the photoluminescence technique or the cathode luminescence technique is 595 nm or less.

6. The two-wavelength semiconductor laser device of claim 5, wherein the first peak wavelength is 710 nm or less.

7. The two-wavelength semiconductor laser device of claim 5, wherein
the first semiconductor laser device has an oscillation wavelength of 760 nm or more and 790 nm or less, and
the second semiconductor laser device has an oscillation wavelength of 650 nm or more and 670 nm or less.

8. The two-wavelength semiconductor laser device of claim 1, wherein the first semiconductor laser device and the second semiconductor laser device each have a light output of 200 mW or more during a CW operation.

9. The two-wavelength semiconductor laser device of claim 8, wherein the first semiconductor laser device and the second semiconductor laser device each have a vertical divergence angle of 18° or less.

10. The two-wavelength semiconductor laser device of claim 9, wherein the second guide layer has a film thickness of 10 nm or more and 43 nm or less.

11. The two-wavelength semiconductor laser device of claim 1, wherein
the first quantum well active layer includes a well layer made of GaAs, and
the second quantum well active layer includes a well layer made of GaInP.

12. The two-wavelength semiconductor laser device of claim 11, wherein a film thickness of the well layer of the first quantum well active layer is smaller than a film thickness of the barrier layer of the first quantum well active layer.

13. The two-wavelength semiconductor laser device of claim 11, wherein the well layer of the first quantum well active layer has a film thickness of 4 nm or less.

14. The two-wavelength semiconductor laser device of claim 11, wherein the well layer of the first quantum well active layer includes two layers.

15. The two-wavelength semiconductor laser device of claim 1, wherein an Al molar ratio of the second cladding layer is larger than an Al molar ratio of the fourth cladding layer.

16. The two-wavelength semiconductor laser device of claim 1, wherein
a lattice constant of the second cladding layer is smaller with respect to a lattice constant of the substrate, and
a lattice constant of the fourth cladding layer is larger than the lattice constant of the second cladding layer.

17. The two-wavelength semiconductor laser device of claim 1, wherein
the second cladding layer and the fourth cladding layer each have a doping concentration of $1\times10^{17}/cm^3$ or more and $1\times10^{18}/cm^3$ or less, and
the doping concentration of the second cladding layer is smaller than the doping concentration of the fourth cladding layer.

18. The two-wavelength semiconductor laser device of claim 1, wherein
the window structure of the first semiconductor laser device includes Zn or Si, and
the window structure of the second semiconductor laser device includes Zn.

19. A method for fabricating a two-wavelength semiconductor laser device comprising a first semiconductor laser device and a second semiconductor laser device each having a window structure in a vicinity of an optical resonator facet, on a first-conductivity type single crystal semiconductor substrate, the method comprising the steps of:
forming a first multilayer structure including at least a first-conductivity type first cladding layer, a first guide layer made of AlGaAs mixed crystal, a first quantum well active layer having a barrier layer made of AlGaAs mixed crystal, a second guide layer made of AlGaAs mixed crystal, and a second-conductivity type second cladding layer, sequentially stacked in a first region where the first semiconductor laser device is to be formed on the semiconductor substrate;
forming a second multilayer structure including at least a first-conductivity type third cladding layer, a third guide layer made of AlGaInP mixed crystal, a second quantum well active layer having a barrier layer made of AlGaInP mixed crystal, a fourth guide layer made of AlGaInP mixed crystal, and a second-conductivity type fourth cladding layer, sequentially stacked in a region where the second semiconductor laser device is to be formed on the semiconductor substrate, the second multilayer structure being spaced from the first multilayer structure; and
thermally diffusing a first impurity and a second impurity of the same species to form the window structure of the first semiconductor laser device in the first multilayer structure, the first impurity being diffused in the window structure of the first semiconductor laser device, and at the same time, form the window structure of the second semiconductor laser device in the second multilayer structure, the second impurity being diffused in the window structure of the second semiconductor laser device,
wherein a peak concentration of the first impurity in the first quantum well active layer in the window structure of the first semiconductor laser device is larger than a peak concentration of the second impurity in the second quantum well active layer in the window structure of the second semiconductor laser device,
the peak concentration of the second impurity is $1\times10^{18}/cm^3$ or more and $1\times10^{19}/cm^3$ or less, and
the thermal diffusion is performed for no longer than a time that allows a minimum peak wavelength of photoluminescence light in the window structure of the first semiconductor laser device.

20. A method for fabricating a two-wavelength semiconductor laser device comprising a first semiconductor laser device and a second semiconductor laser device each having a window structure in a vicinity of an optical resonator facet, on a first-conductivity type single crystal semiconductor substrate, the method comprising the steps of:
forming a first multilayer structure including at least a first-conductivity type first cladding layer, a first guide layer made of AlGaAs mixed crystal, a first quantum well active layer having a barrier layer made of AlGaAs mixed crystal, a second guide layer made of AlGaAs mixed crystal, and a second-conductivity type second cladding layer, sequentially stacked in a first region where the first semiconductor laser device is to be formed on the semiconductor substrate;

forming a second multilayer structure including at least a first-conductivity type third cladding layer, a third guide layer made of AlGaInP mixed crystal, a second quantum well active layer having a barrier layer made of AlGaInP mixed crystal, a fourth guide layer made of AlGaInP mixed crystal, and a second-conductivity type fourth cladding layer, sequentially stacked in a region where the second semiconductor laser device is to be formed on the semiconductor substrate, the second multilayer structure being spaced from the first multilayer structure;

ion-implanting a first impurity into at least the first quantum well active layer in the first multilayer structure; and thermally diffusing a second impurity of a species different from that of the first impurity to form the window structure of the second semiconductor laser device in the second multilayer structure, the second impurity being diffused in the window structure of the second semiconductor laser device, and at the same time, forming the window structure of the first semiconductor laser device, the first impurity ion-implanted in the first multilayer structure being diffused in the window structure of the first semiconductor laser device, wherein a peak concentration of the first impurity in the first quantum well active layer in the window structure of the first semiconductor laser device is larger than a peak concentration of the second impurity in the second quantum well active layer in the window structure of the second semiconductor laser device, and the peak concentration of the second impurity is $1 \times 10^{18}/\text{cm}^3$ or more and $1 \times 10^{19}/\text{cm}^3$ or less.

21. The method of claim 20, wherein a diffusion end closer to the semiconductor substrate of the first impurity in the window structure of the first semiconductor laser device is located in the first cladding layer, and a diffusion end closer to the semiconductor substrate of the second impurity in the window structure of the second semiconductor laser device is located in the third cladding layer.

22. The method of claim 20, wherein the thermal diffusion is performed for no longer than a time that allows a minimum peak wavelength of photoluminescence light in the window structure of the first semiconductor laser device.

23. The method of claim 20, wherein the first impurity is Si, and the second impurity is Zn.

* * * * *